(12) United States Patent
Shiraki et al.

(10) Patent No.: US 10,366,826 B2
(45) Date of Patent: Jul. 30, 2019

(54) DUAL-MODE CHOKE COIL AND HIGH-FREQUENCY FILTER USING SAME, AND ON-BOARD MOTOR INTEGRATED ELECTRIC POWER STEERING AND ON-BOARD CHARGING DEVICE

(71) Applicant: Mitsubishi Electric Corporation, Chiyoda-ku (JP)

(72) Inventors: Yasuhiro Shiraki, Chiyoda-ku (JP);
Satoshi Yoneda, Chiyoda-ku (JP);
Katsuhiko Omae, Chiyoda-ku (JP);
Nobuyuki Haruna, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 283 days.

(21) Appl. No.: 15/518,398

(22) PCT Filed: Oct. 20, 2015

(86) PCT No.: PCT/JP2015/079504
§ 371 (c)(1),
(2) Date: Apr. 11, 2017

(87) PCT Pub. No.: WO2016/088460
PCT Pub. Date: Jun. 9, 2016

(65) Prior Publication Data
US 2017/0309395 A1    Oct. 26, 2017

(30) Foreign Application Priority Data

Dec. 3, 2014   (JP) ................................. 2014-244667

(51) Int. Cl.
*B60L 11/08*   (2006.01)
*B60L 11/18*   (2006.01)
(Continued)

(52) U.S. Cl.
CPC .............. *H01F 27/38* (2013.01); *B60L 50/13* (2019.02); *B60L 50/51* (2019.02); *B60R 16/03* (2013.01);
(Continued)

(58) Field of Classification Search
None
See application file for complete search history.

(56) References Cited

U.S. PATENT DOCUMENTS

| | | | |
|---|---|---|---|
| 2006/0145804 A1* | 7/2006 | Matsutani | H01F 27/027 336/200 |
| 2007/0047266 A1* | 3/2007 | Nakahori | H01F 38/00 363/17 |
| 2012/0194313 A1* | 8/2012 | Wohlforth | H01F 27/38 336/170 |

FOREIGN PATENT DOCUMENTS

| | | |
|---|---|---|
| CN | 101521089 A | 9/2009 |
| JP | 59-84827 U | 6/1984 |

(Continued)

OTHER PUBLICATIONS

International Search Report dated Jan. 19, 2016, in PCT/JP2015/079504 filed Oct. 20, 2015.
(Continued)

*Primary Examiner* — Jared Fureman
*Assistant Examiner* — Aqeel H Bukhari
(74) *Attorney, Agent, or Firm* — Oblon, McClelland, Maier & Neustadt, L.L.P.

(57) ABSTRACT

A dual-mode choke coil includes: a lower core that has a first through fourth columnar body; a first upper core and a second upper core; a first coil in which two coil conductors are respectively wound onto the first columnar body and a third columnar body in mutually different directions and are connected in series; and a second coil in which two coil conductors are respectively wound onto a second columnar
(Continued)

body and the fourth columnar body in mutually different directions and are connected in series, and in which the winding direction of the coil conductor of the second columnar body is the same as that of the coil conductor of the first columnar body. With this configuration, both common mode noise and normal mode noise can be reduced.

19 Claims, 34 Drawing Sheets

(51) Int. Cl.
| | |
|---|---|
| *B60R 16/03* | (2006.01) |
| *H01F 27/38* | (2006.01) |
| *H02J 7/02* | (2016.01) |
| *H02J 7/14* | (2006.01) |
| *H03H 7/01* | (2006.01) |
| *H03H 7/09* | (2006.01) |
| *H02M 1/10* | (2006.01) |
| *H02M 1/42* | (2007.01) |
| *H01F 3/10* | (2006.01) |
| *H01F 17/06* | (2006.01) |
| *H01F 37/00* | (2006.01) |
| *B60L 50/13* | (2019.01) |
| *B60L 50/51* | (2019.01) |

(52) U.S. Cl.
CPC ............... *H01F 3/10* (2013.01); *H01F 17/06* (2013.01); *H01F 37/00* (2013.01); *H02J 7/022* (2013.01); *H02J 7/1423* (2013.01); *H02M 1/10* (2013.01); *H02M 1/4208* (2013.01); *H03H 7/01* (2013.01); *H03H 7/09* (2013.01)

(56) References Cited

FOREIGN PATENT DOCUMENTS

| | | |
|---|---|---|
| JP | 2-229407 A | 9/1990 |
| JP | 4-103107 A | 4/1992 |
| JP | 2001-230120 A | 8/2001 |
| JP | 2002-299133 A | 10/2002 |
| JP | 2006-222387 A | 8/2006 |
| JP | 2007-235580 A | 9/2007 |
| JP | 2008-37380 A | 2/2008 |
| JP | 2008-172162 A | 7/2008 |
| JP | 2011-9985 A | 1/2011 |

OTHER PUBLICATIONS

Extended European Search Report dated May 9, 2018 in European Patent Application No. 18152611.2, 8 pages.
Office Action dated Aug. 29, 2018 in Chinese Patent Application No. 201580058375.6, with unedited computer generated English translation, 15 pages.

* cited by examiner

DUAL-MODE CHOKE COIL AND HIGH-FREQUENCY FILTER USING SAME, AND ON-BOARD MOTOR INTEGRATED ELECTRIC POWER STEERING AND ON-BOARD CHARGING DEVICE

FIELD OF THE INVENTION

The present invention relates to: a dual mode choke coil which is provided between a power source and a load device, and reduces noise generated on the load device side and transmitted to the power source side; and a high frequency filter using same; and an on-board motor integrated electric power steering; and an on-board charging device.

BACKGROUND ART

For example, electro-magnetic interference (EMI) noise generated by the high speed switching operation of an inverter of a power conversion device that controls an alternating current (AC) driving motor serving as a load device becomes conduction noise and flows in a power source line and the earth; and accordingly, the noise is transmitted to other electrical apparatus to have the possibility of harmful influence such as causing an erroneous operation. There were two types of noise: normal mode noise that is transmitted in a transmission path between a power source and the load device; and common mode noise that is transmitted between the transmission path and the earth. A noise filter is used as a countermeasure that reduces these types of noise and, more particularly, there is a dual mode choke coil serving as the noise filter that reduces both types of noise.

For example, a noise filter in Patent Document 1 discloses that, in first and second common mode choke coils which are for suppressing common mode noise that forms EMI noise from being transmitted to the power source side, the first common mode choke coil forms a first magnetic substance core having a pair of magnetic legs formed with a protrusion part on both ends of the first magnetic substance core; the second common mode choke coil forms a second magnetic substance core which has the same configuration as the first magnetic substance core, and whose protrusion parts on both ends of the second magnetic substance core are disposed so as to be opposite to the protrusion parts on both ends of the first magnetic substance core via air gaps. Further, the winding directions of windings of the same phase, which are wound around the respective magnetic legs opposite to each other via the air gap between the first and second magnetic substance cores are reversed, and a high impedance against normal mode noise is obtained by magnetic flux of a magnetic circuit formed by the windings of the same phase; and this removes normal mode choke coils to achieve a reduction in size of the filter.

PRIOR ART DOCUMENT

Patent Document

Patent Document 1: JP2007-235580A

SUMMARY OF THE INVENTION

Problems to be Solved by the Invention

However, the conventional noise filter is configured such that two common mode choke coils are arranged at regularly spaced gaps, as the configuration of the dual mode choke coil; and accordingly, when a normal mode current flows in the dual mode choke coil, magnetic flux to be generated is generated in each half region of two common mode choke coils and in independent two paths in which the magnetic flux passes through the gap between two common mode choke coils. On the other hand, the configuration is such that when a common mode current flows in the dual mode choke coil, magnetic flux to be generated is substantially independently generated by using each common mode choke coil as a path, common mode inductance of the dual mode choke coil is substantially equal to the sum of each common mode inductance in which each common mode choke coil has, and the magnetic flux is difficult to be generated in a path other than each common mode choke coil; and accordingly, a problem exists in that it is difficult to set a value equal to or higher than that.

The present invention has been made to solve the above described problem, and an object of the present invention is to provide a dual mode choke coil having a high reduction effect in both common mode noise and normal mode noise, and a high frequency filter using same, and an on-board motor integrated electric power steering, and an on-board charging device.

Means for Solving the Problems

In order to solve the above described problem, according to the present invention, there is provided a first dual mode choke coil including: a lower core made of a magnetic substance, in which four columnar bodies whose respective axes are upright are placed on a quadrilateral square of a flat plate, the columnar bodies being such that a first columnar body and a second columnar body are arranged in parallel to a third columnar body and a fourth columnar body; a first coil in which the winding direction of a first coil conductor wound around the first columnar body and the winding direction of a third coil conductor wound around the third columnar body are different to each other, and the first coil conductor and the third coil conductor are connected in series; a second coil in which the winding direction of a second coil conductor wound around the second columnar body and the winding direction of a fourth coil conductor wound around the fourth columnar body are different to each other, and the second coil conductor and the fourth coil conductor are connected in series; a first upper core made of a magnetic substance, which is brought in contact with upper portions of the first columnar body and the second columnar body; and a second upper core made of a magnetic substance, which is brought in contact with upper portions of the third columnar body and the fourth columnar body. In the first dual mode choke coil, the first upper core and the second upper core are arranged with a gap formed therebetween; and the winding direction of the first coil conductor and the winding direction of the second coil conductor are different.

Furthermore, according to the present invention, there is provided a second dual mode choke coil including: a lower core made of a magnetic substance, in which four columnar bodies whose respective axes are upright are placed on a quadrilateral square of a flat plate, the columnar bodies being such that a first columnar body and a second columnar body are arranged in parallel to a third columnar body and a fourth columnar body; a first coil in which the winding direction of a first coil conductor wound around the first columnar body and the winding direction of a third coil conductor wound around the third columnar body are different to each other, and the first coil conductor and the third coil conductor are connected in parallel; a second coil in which the winding direction of a second coil conductor wound around the second columnar body and the winding direction of a fourth coil conductor wound around the fourth columnar body are different to each other, and the second coil conductor and the fourth coil conductor are connected in parallel; a first upper core made of a magnetic substance, which is brought in contact with upper portions of the first columnar body and the second columnar body; and a second upper core made of a magnetic substance, which is brought in contact with upper portions of the third columnar body and the fourth columnar body. In the second dual mode choke coil, the first upper core and the second upper core are arranged with a gap formed therebetween; and the winding direction of the first coil conductor and the winding direction of the second coil conductor are different.

Moreover, according to the present invention, there is provided a first high frequency filter including the dual mode choke coil, and at least one capacitor connected between the first coil and the second coil.

Additionally, according to the present invention, there is provided a second high frequency filter including the dual mode choke coil, an earth terminal, and at least one capacitor connected between the earth terminal and the first coil and between the earth terminal and the second coil.

In addition, according to the present invention, there is provided an on-board motor integrated electric power steering including the dual mode choke coil at a direct current input portion.

Besides, according to the present invention, there is provided an on-board charging device including the dual mode choke coil at an alternating current input portion.

Advantageous Effect of the Invention

According to the dual mode choke coil of the present invention, a plurality of magnetic flux paths are generated at a dual mode core portion, whereby a higher inductance for a common mode current can be achieved than in the conventional example and an effect exists in that common mode noise can be more largely reduced.

Furthermore, according to the first high frequency filter of the present invention, the dual mode choke coil is used as a normal mode choke coil that has a reduction effect of a normal mode noise current and a capacitance circuit is added between a pair of coils thereof, whereby an effect exists in that a high frequency filter corresponding to a high frequency of the normal mode noise current can be achieved.

Moreover, according to the second high frequency filter of the present invention, the dual mode choke coil is used as a common mode choke coil that has a reduction effect of a common mode noise current and a capacitance circuit is added between a pair of coils thereof via the earth terminal, whereby an effect exists in that a high frequency filter corresponding to a high frequency of the common mode noise current can be achieved.

Additionally, according to the on-board motor integrated electric power steering of the present invention, the dual mode choke coil is equipped as a noise filter in order to reduce conduction noise associated with switching operation of an inverter circuit that drives a motor, whereby an effect exists in that the conduction noise can be considerably reduced in a frequency band equal to or lower than 1.5 MHz.

In addition, according to the on-board charging device of the present invention, the dual mode choke coil is equipped as a noise filter in order to reduce conduction noise associated with switching operation of an inverter circuit that controls a charging current, whereby an effect exists in that the conduction noise can be considerably reduced in a frequency band equal to or lower than 1.5 MHz.

MODE FOR CARRYING OUT THE INVENTION

Hereinafter, the details of a dual mode choke coil, a high frequency filter, a motor integrated electric power steering, and an on-board charging device according to embodiments of the present invention will be described with reference to FIG. 1 to FIG. 34.

Embodiment 1

Figure 1:
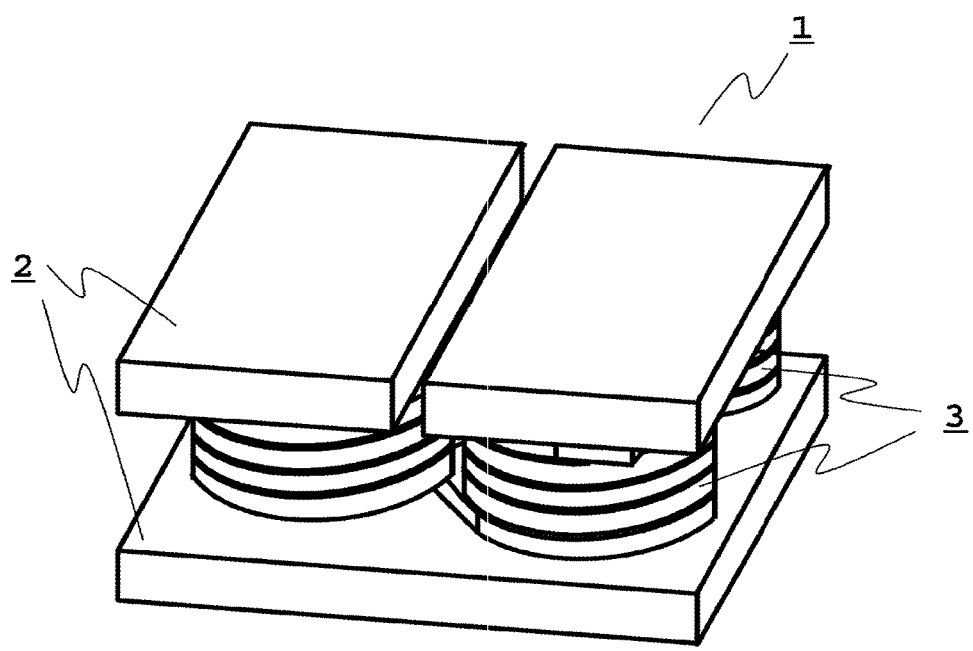
FIG. 1 is a perspective view showing the entire configuration of a dual mode choke coil according to Embodiment 1.
Figure 2:
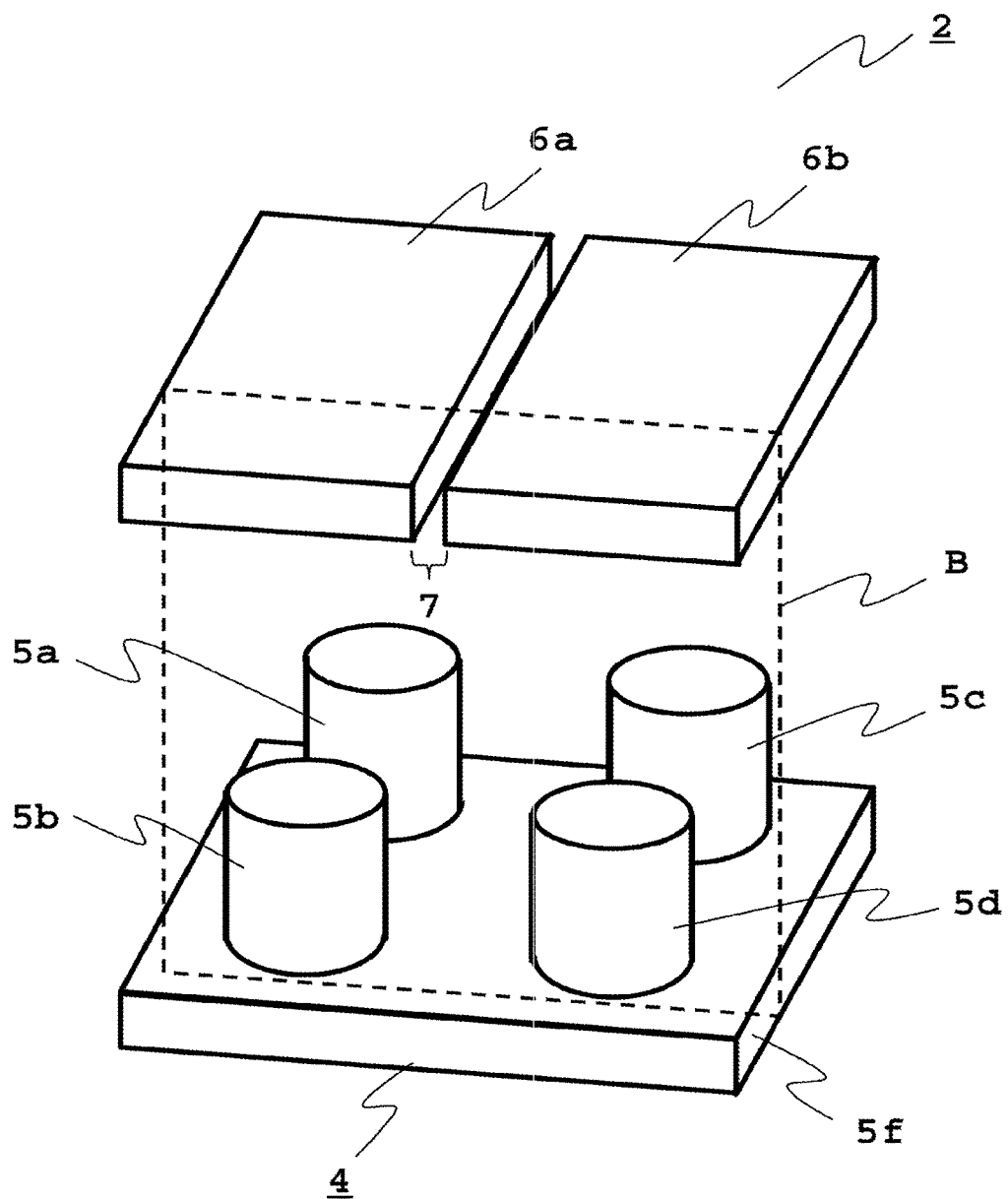
FIG. 2 is an exploded perspective view of a dual mode core portion in Embodiment 1.
Figure 3:
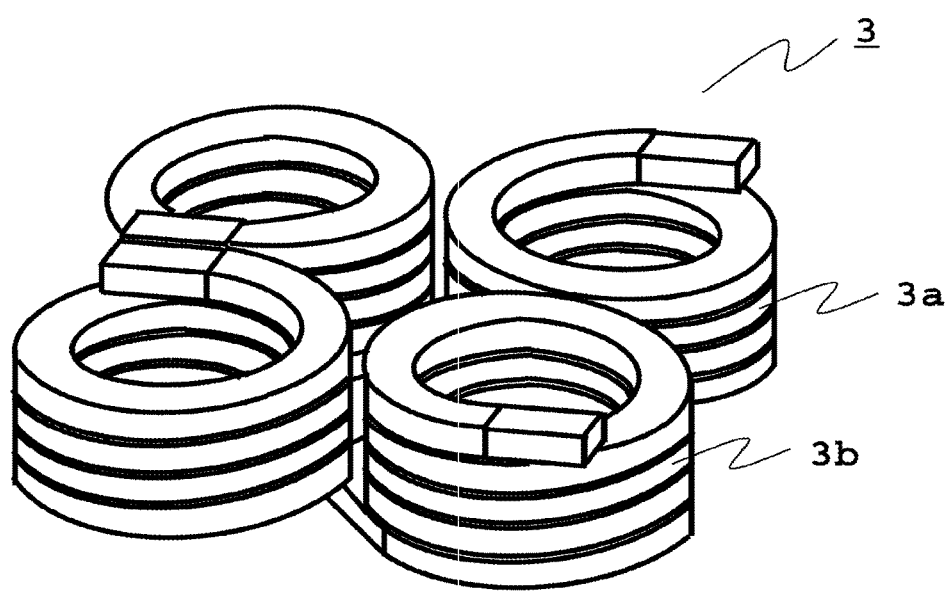
FIG. 3 is a perspective view showing a coil portion in Embodiment 1.
Figure 4:
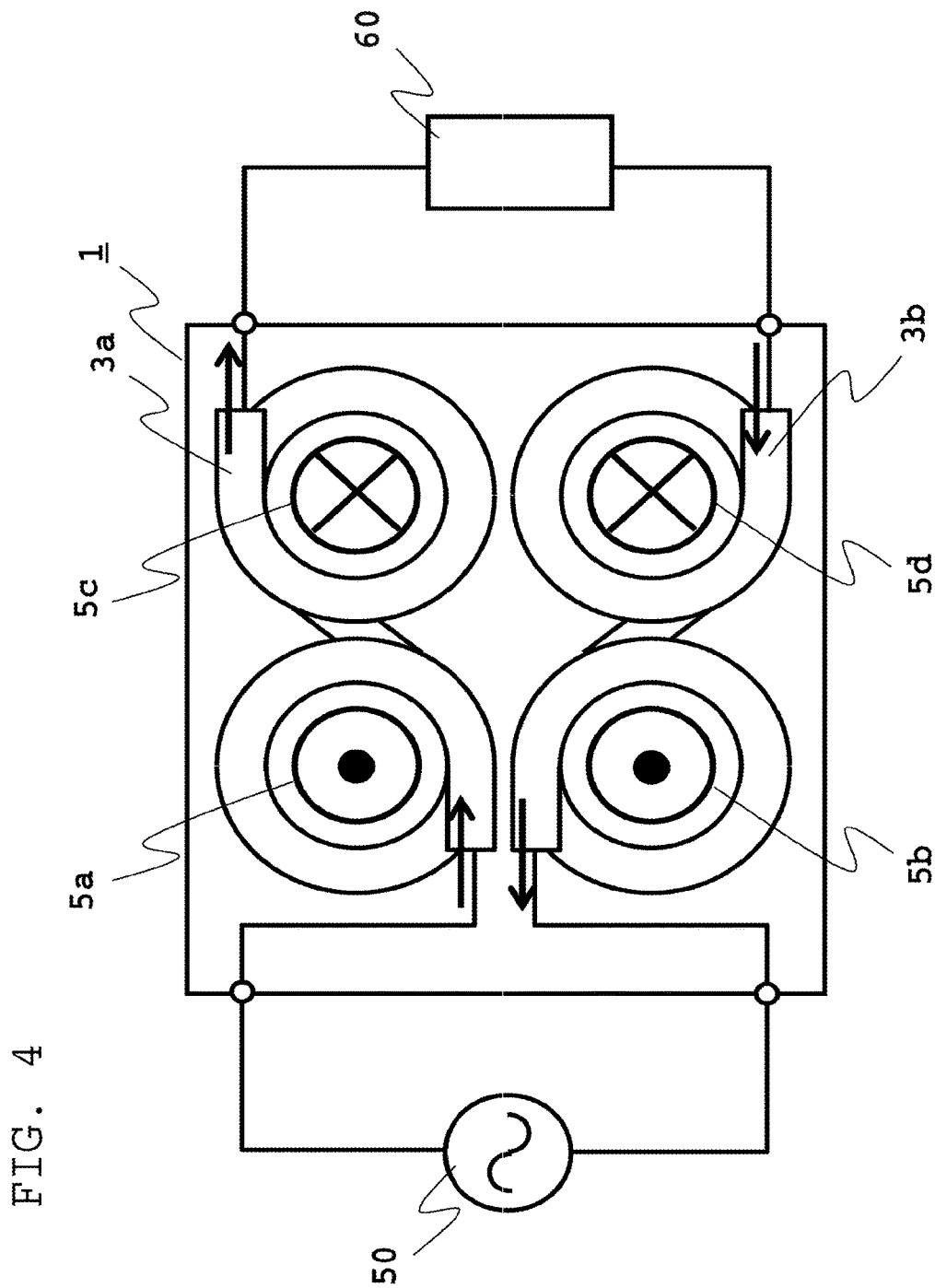
FIG. 4 is a schematic view showing a connection between the dual mode choke coil and a power source and between the dual mode choke coil and a load in Embodiment 1.

FIG. 1 is a perspective view showing the entire configuration of a dual mode choke coil according to Embodiment 1; FIG. 2 is an exploded perspective view of a dual mode core portion; FIG. 3 is a perspective view showing a coil portion; and FIG. 4 is a schematic view showing a connection between the dual mode choke coil and a power source and between the dual mode choke coil and a load.

First, the entire configuration of the dual mode choke coil according to Embodiment 1 will be described by using FIG. 1 to FIG. 4. As shown in FIG. 1, a dual mode choke coil 1 is composed of a dual mode core portion 2 and a coil portion 3. As shown in FIG. 2, the dual mode core portion 2 includes: a lower core 4 made of a magnetic substance, in which a first columnar body 5a, a second columnar body 5b, a third columnar body 5c, and a fourth columnar body 5d are arranged on a flat plate 5f, the third columnar body 5c and the fourth columnar body 5d being arranged in parallel to axes formed by the first columnar body 5a and the second columnar body 5b; a first upper core 6a is a flat plate-shaped body made of a magnetic substance, which is brought in contact with upper portions of the first columnar body 5a and the second columnar body 5b; and a second upper core 6b is a flat plate-shaped body made of a magnetic substance, which is brought in contact with upper portions of the third columnar body 5c and the fourth columnar body 5d with a gap 7 with respect to the first upper core 6a. Furthermore, as shown in FIG. 3, the coil portion 3 includes: a first coil 3a in which two coil conductors are connected in series, each of two coil conductors being wound around the first columnar body 5a and the third columnar body 5c so that magnetic flux directions generated to each other are reversed; and a second coil 3b in which two coil conductors are connected in series, each of two coil conductors being wound around the second columnar body 5b and the fourth columnar body 5d so that magnetic flux directions generated to each other are reversed, two coil conductors being arranged so that the magnetic flux direction generated by the coil conductor wound around the first columnar body 5a is the same as the magnetic flux direction generated by the coil conductor wound around the second columnar body 5b. Here, the direction of the above magnetic flux is defined such that, as shown in FIG. 4, when the dual mode choke coil 1 is connected to the power source 50 and the load 60 and a current that flows during driving the load is shown by a current direction 8 in FIG. 4. The direction of the magnetic flux generated in the first columnar body 5a and the second columnar body 5b is a direction from the deep side to the front side of the page space; and the direction of the magnetic flux generated in the third columnar body 5c and the fourth columnar body 5d is a direction from the front side to the deep side of the page space. Incidentally, a power conversion circuit and the like are omitted.

Next, operation for a common mode current of the dual mode choke coil 1 in Embodiment 1 will be described by using FIG. 5 to FIG. 7.

Figure 5:
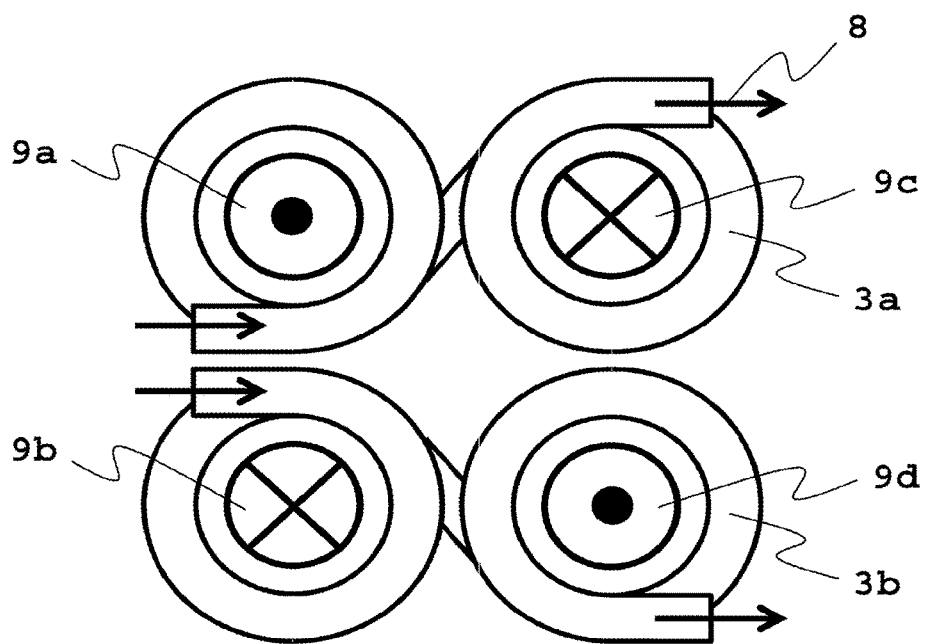
FIG. 5 is a view for a common mode current, the view being seen from the top of the coil portion in Embodiment 1.
Figure 6:
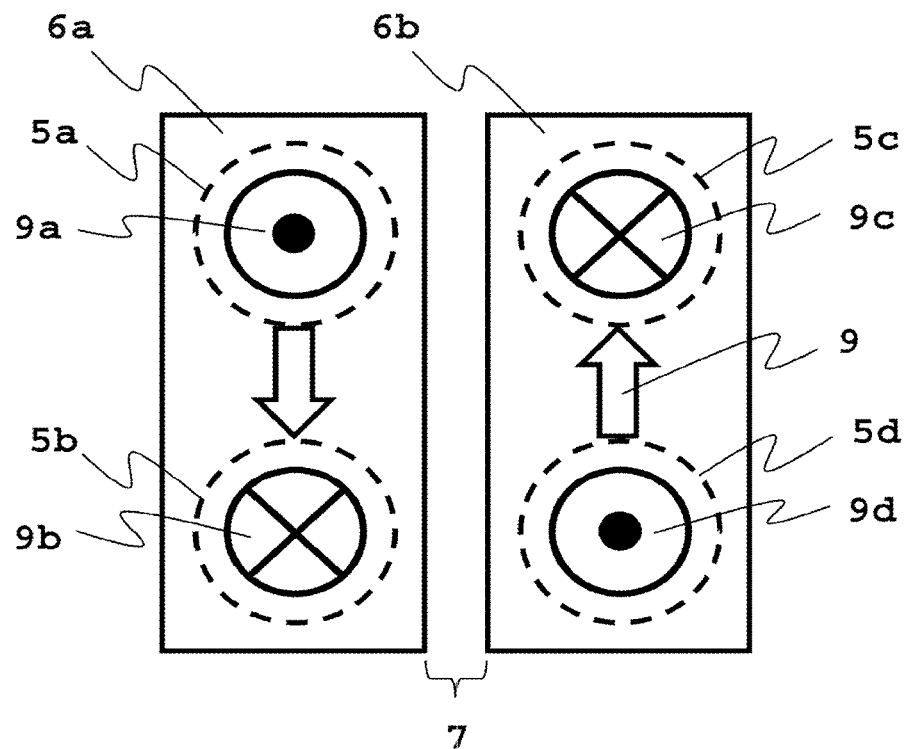
FIG. 6 is a view for the common mode current, the view being seen from the top of an upper core in Embodiment 1.

FIG. 5 is a top view of the first coil 3a and the second coil 3b and shows common mode current directions and magnetic flux directions generated when the common mode current flows. In FIG. 5, arrows 8 show the directions of the current that flows in the first coil 3a and in the second coil 3b; and a magnetic flux direction 9a to a magnetic flux direction 9d show the magnetic flux directions generated in the first columnar body 5a to the fourth columnar body 5d, respectively. Then, in FIG. 5 to FIG. 7, each of the magnetic flux directions 9a and 9d shows a direction from the deep side to the front side of the page space; and each of the magnetic flux directions 9b and 9c shows a direction from the front side to the deep side of the page space. FIG. 6 is a top view of the first upper core 6a and the second upper core 6b and shows magnetic flux directions generated in the first upper core 6a and the second upper core 6b when the common mode current flows. Similarly, FIG. 7 is a top view of the lower core 4 and shows magnetic flux directions generated in the lower core 4 when the common mode current flows. In FIG. 6 and FIG. 7, arrows 9 show the magnetic flux directions.

If the common mode current that is the same phase current flows in the first coil 3a and the second coil 3b, the magnetic flux is generated in the first columnar body 5a to the fourth columnar body 5d as shown in the direction 9a to the direction 9d in FIG. 5, respectively. When considering the magnetic flux generated in the first upper core 6a, the magnetic flux is generated in the first columnar body 5a and reaches the first upper core 6a in a direction from the deep side to the front side of the page space in FIG. 6 and then a magnetic flux direction to be generated tries to take a path to be drawn into the second columnar body 5b or the third columnar body 5c, the path being a direction from the front side to the deep side of the page space. However, the gap 7 exists in the path that reaches from the first columnar body 5a to the third columnar body 5c and a magnetic loss becomes larger than that of the path that reaches from the first columnar body 5a to the second columnar body 5b; and accordingly, the magnetic flux is hardly generated in the path that reaches from the first columnar body 5a to the third columnar body 5c. Consequently, almost all the magnetic flux generated in the first columnar body 5a takes the path that reaches the second columnar body 5b. Similarly, almost all magnetic flux generated in the fourth columnar body 5d takes a path that reaches the third columnar body 5c. As a result, as shown by magnetic flux directions 9 in FIG. 6, the magnetic flux is generated in a direction from the first columnar body 5a to the second columnar body 5b in the first upper core 6a; and the magnetic flux is generated in a direction from the fourth columnar body 5d to the third columnar body 5c in the second upper core 6b.

Figure 7:
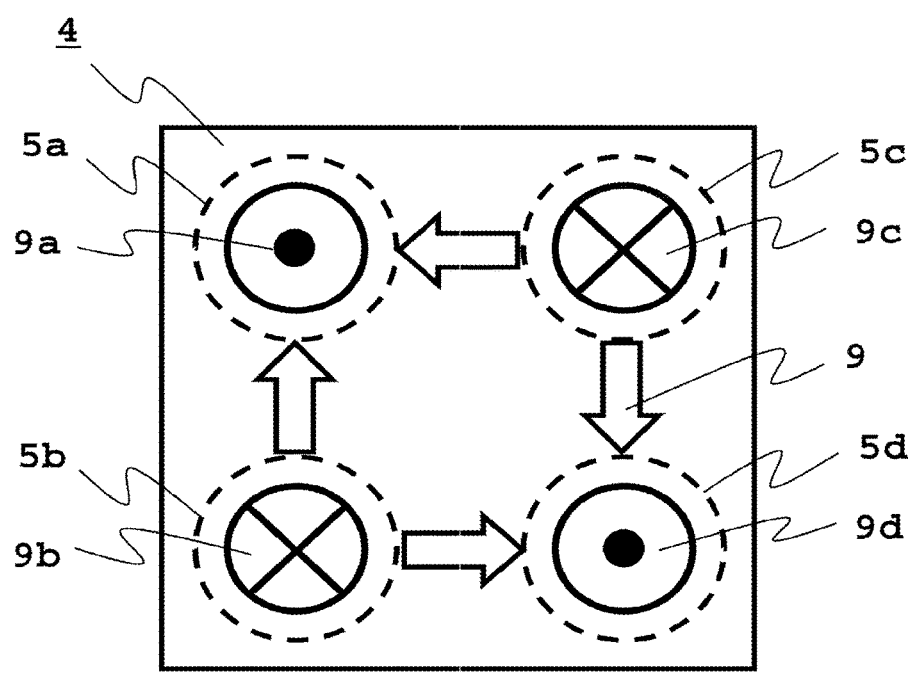
FIG. 7 is a view for the common mode current, the view being seen from the top of a lower core in Embodiment 1.

On the other hand, when considering the magnetic flux generated in the lower core 4, the magnetic flux generated in the second columnar body 5b reaches the lower core 4 in a direction from the front side to the deep side of the page space in FIG. 7 and then a magnetic flux direction to be generated tries to take a path to be drawn into the first columnar body 5a or the fourth columnar body 5d, the path being a direction from the deep side to the front side of the page space. At that time, different from the first upper core 6a and the second upper core 6b, since the gap does not exist in the lower core 4, the magnetic flux generated in the second columnar body 5b takes a path that reaches the first columnar body 5a or the fourth columnar body 5d. Similarly, the magnetic flux generated in the third columnar body 5c also takes a path that reaches the first columnar body 5a or the fourth columnar body 5d. As a result, as shown by magnetic flux directions 9 in FIG. 7, the magnetic flux is generated in the lower core 4 in a direction from the second columnar body 5b to the first columnar body 5a or the fourth columnar body 5d and in a direction from the third columnar body 5c to the first columnar body 5a or the fourth columnar body 5d.

Therefore, if the common mode current flows in the dual mode choke coil 1 according to this Embodiment 1, a plurality of magnetic flux paths are generated in the dual mode core portion 2 and inductance for the common mode current can be achieved. Further, in the dual mode choke coil 1 according to this Embodiment 1, as shown in FIG. 7, since the magnetic flux is also generated in the lower core 4 in the direction from the third columnar body 5c to the first columnar body 5a and in the direction from the second columnar body 5b to the fourth columnar body 5d, more magnetic flux paths are generated than that of the conventional example; and, as a result, a higher inductance for the common mode current can be achieved than that of the conventional example.

Subsequently, operation for a normal mode current of the dual mode choke coil 1 in Embodiment 1 will be described by using FIG. 8 to FIG. 10.

Figure 8:
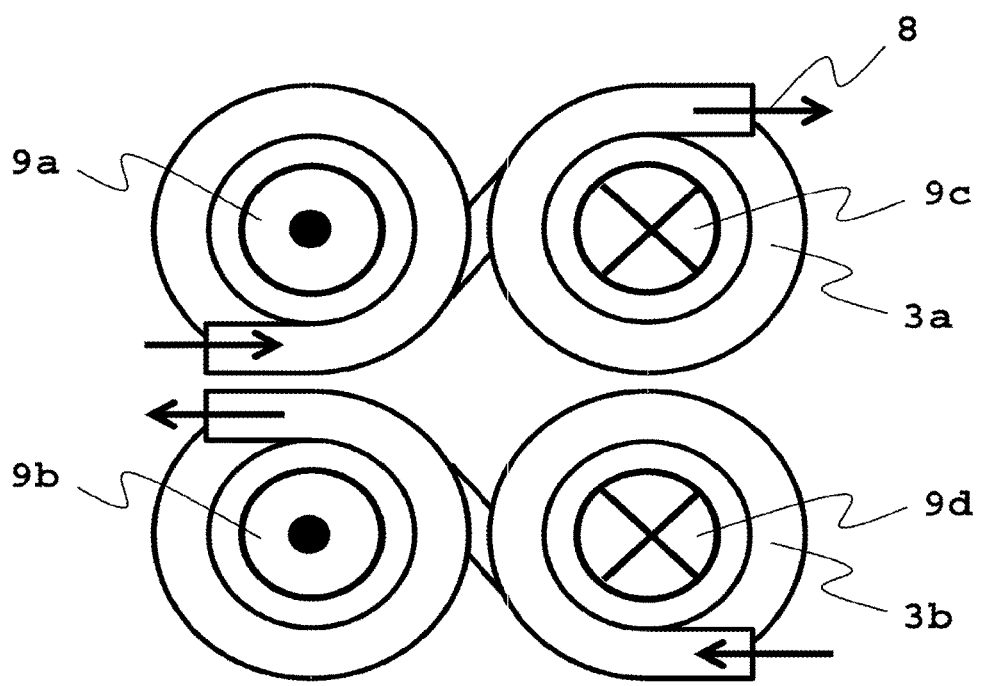
FIG. 8 is a view for a normal mode current, the view being seen from the top of the coil portion in Embodiment 1.
Figure 9:
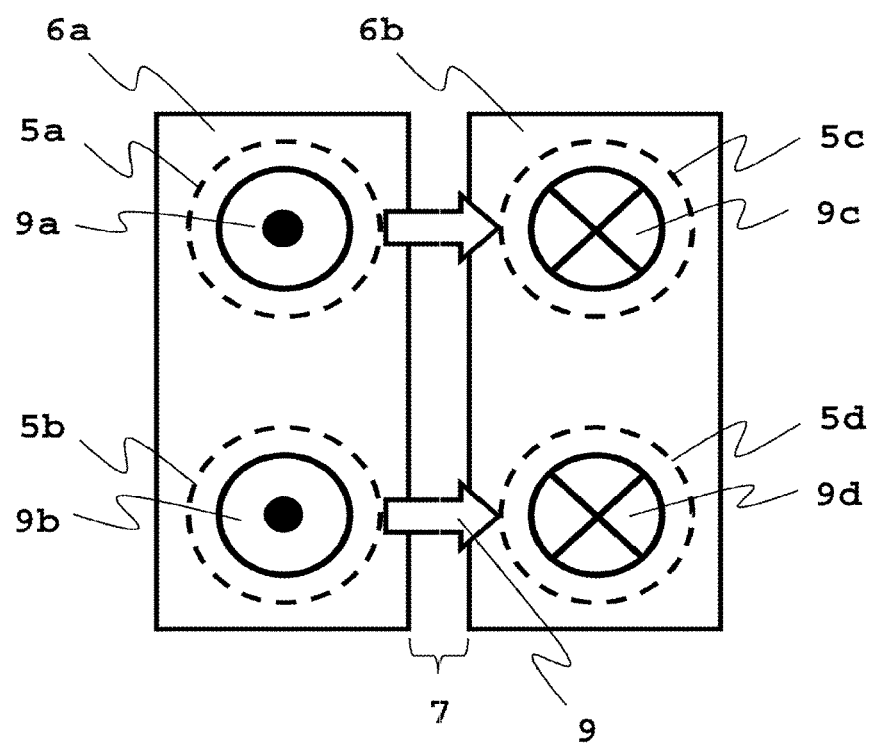
FIG. 9 is a view for the normal mode current, the view being seen from the top of the upper core in Embodiment 1.

FIG. 8 is a top view of the first coil 3a and the second coil 3b and shows normal mode current directions and magnetic flux directions to be generated when the normal mode current flows. In FIG. 8, arrows 8 show the directions of current flow; and reference letter 9a to reference letter 9d show the directions of the magnetic flux generated in the first columnar body 5a to the fourth columnar body 5d, respectively. In FIG. 8 to FIG. 10, each of the magnetic flux directions 9a and 9b shows a direction from the deep side to the front side of the page space; and each of the magnetic flux directions 9c and 9d shows a direction from the front side to the deep side of the page space. FIG. 9 is a top view of the first upper core 6a and the second upper core 6b and shows magnetic flux directions to be generated in the first upper core 6a and the second upper core 6b when the normal mode current flows. Similarly, FIG. 10 is a top view of the lower core 4 and shows magnetic flux directions to be generated in the lower core 4 when the normal mode current flows. In FIG. 9 and FIG. 10, arrows 9 show magnetic flux directions.

If the normal mode current that is a reverse phase current flows in the first coil 3a and the second coil 3b, the magnetic flux is generated in the first columnar body 5a to the fourth columnar body 5d as shown in the direction 9a to the direction 9d in FIG. 8, respectively. When considering the magnetic flux generated in the first upper core 6a, the magnetic flux is generated in the first columnar body 5a and reaches the first upper core 6a in a direction from the deep side to the front side of the page space in FIG. 9 and then a magnetic flux direction to be generated tries to take a path to be drawn into the third columnar body 5c or the fourth columnar body 5d, the path being a direction from the front side to the deep side of the page space. Here, since the gap 7 exists in both paths, a magnetic loss is large; however, since there does not exist other path that does not pass through the gap 7, these paths are compelled to be taken; and in two paths, a path with a shorter distance from the first columnar body 5a to the third columnar body 5c is taken. Consequently, almost all the magnetic flux generated in the first columnar body 5a takes a path that reaches the third columnar body 5c via the gap 7. Similarly, almost all the magnetic flux generated in the second columnar body 5b takes a path that reaches the fourth columnar body 5d via the gap 7. As a result, as shown by magnetic flux directions 9 in FIG. 9, the magnetic flux is generated in the first upper core 6a and the second upper core 6b in a direction from the first columnar body 5a to the third columnar body 5c and in a direction from the second columnar body 5b to the fourth columnar body 5d.

Figure 10:
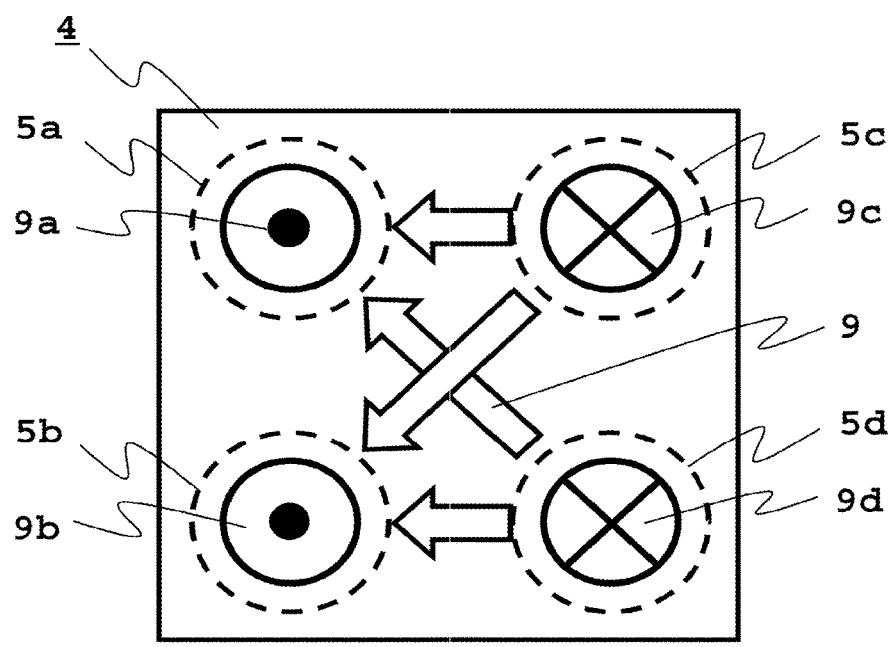
FIG. 10 is a view for the normal mode current, the view being seen from the top of the lower core in Embodiment 1.

On the other hand, when considering the magnetic flux generated in the lower core 4, the magnetic flux generated in the third columnar body 5c reaches the lower core 4 in a direction from the front side to the deep side of the page space in FIG. 10 and then a magnetic flux direction to be generated takes a path to be drawn into the first columnar body 5a or the second columnar body 5b, the path being a direction from the deep side to the front side of the page space. Similarly, the magnetic flux generated in the fourth columnar body 5d also takes a path that reaches the first columnar body 5a or the second columnar body 5b. As a result, as shown by magnetic flux directions 9 in FIG. 10, the magnetic flux is generated in the lower core 4 in a direction from the third columnar body 5c to the first columnar body 5a or the second columnar body 5b and in a direction from the fourth columnar body 5d to the first columnar body 5a or the second columnar body 5b.

Therefore, if the normal mode current flows in the dual mode choke coil 1 according to this Embodiment 1, a plurality of magnetic flux paths are generated in the dual mode core portion 2 and inductance for the normal mode current can be achieved. Further, in the dual mode choke coil 1 according to this Embodiment 1, as shown in FIG. 10, since the magnetic flux is also generated in the lower core 4 in the direction from the third columnar body 5c to the second columnar body 5b and in the direction from the fourth columnar body 5d to the first columnar body 5a, more magnetic flux paths are generated than that of the conventional example; and, as a result, a higher inductance for the normal mode current can be achieved than that of the conventional example.

Here, since all the magnetic flux paths to be generated passes through the gap 7 when the normal mode current flows, the magnetic flux is concentrated in the gap 7. As a result, the dual mode core portion 2 is less likely to cause magnetic saturation; and even when a DC as an operation mode of an apparatus or a low frequency normal mode current flows, the inductance for the normal mode current can be maintained. More specifically, the dual mode choke coil having a higher inductance for the common mode current and the normal mode current can be achieved than that of the conventional example by the dual mode choke coil 1 according to this Embodiment 1, that is, by one component.

Furthermore, since the dual mode core portion is of integrated type, the dual mode choke coil 1 according to this Embodiment 1 has a more robust structure than that of the conventional example in which a core is of a separate type and has a feature in which a gap size is difficult to fluctuate by external force such as vibration.

Moreover, in the dual mode choke coil 1 according to Embodiment 1, the first upper core 6a, the second upper core 6b, and the lower core 4 of the dual mode core portion are each a cuboid shape and the columnar body is a columnar shape. However, if the same effect as that of the dual mode choke coil 1 according to this Embodiment 1 can be obtained, the shape of each core is not limited to the cuboid shape or the column shape. Ferrite can be used as the magnetic substance in the dual mode core portion 2; however, other magnetic substance may be permissible.

Additionally, in the dual mode choke coil 1 according to Embodiment 1, a conductive wire-shaped metal conductor is used in the coil portion 3; however, it may be permissible to form by a conductor pattern of a thick copper substrate and the like.

Figure 11:
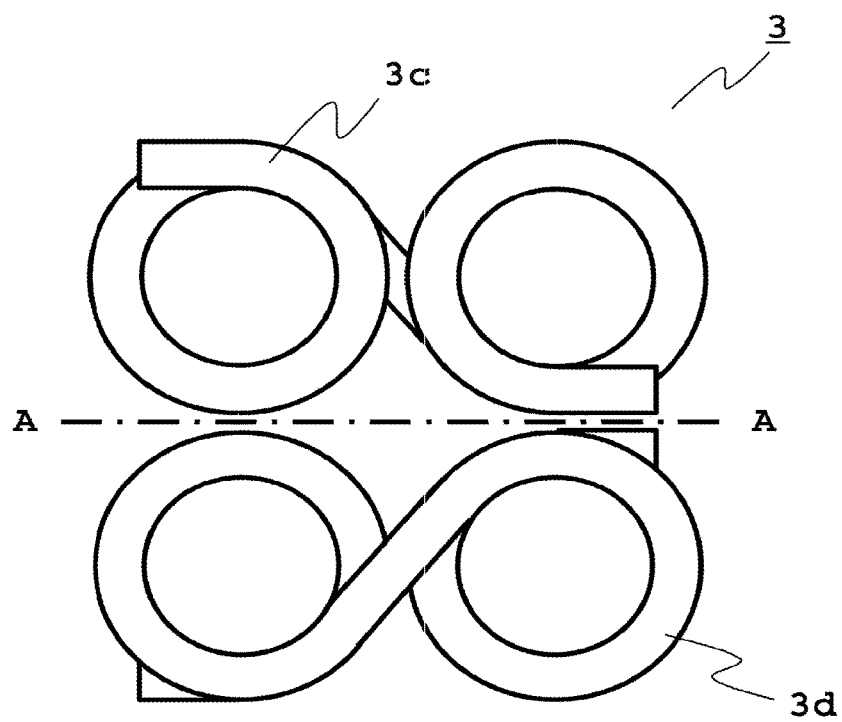
FIG. 11 is a plan view showing other embodiment of the arrangement of the coils in Embodiment 1.

In addition, as shown in a plan view of other embodiment of coil arrangement in FIG. 11, a coil portion 3 is constituted by using the same type of coil in a first coil 3c and a second coil 3d, and the second coil 3d and the first coil 3c may be inverted with respect to an A-A axis. As described above, if the first coil 3c and the second coil 3d are of the same type of shape, the number of coil types can be reduced.

Figure 12:
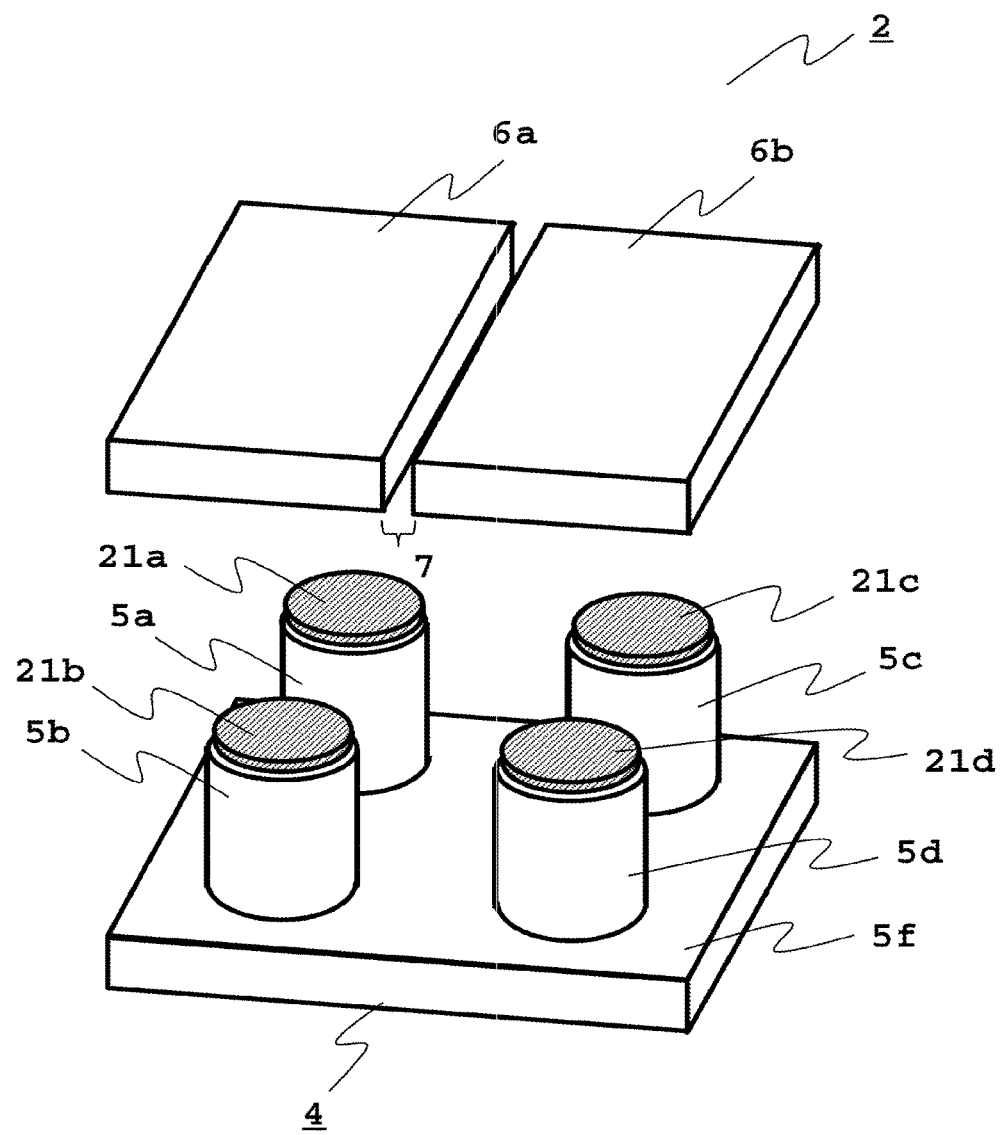
FIG. 12 is an exploded perspective e view showing other embodiment in which a rubber material that is an elastic body contained with magnetic substance powder is arranged in a dual mode core portion in Embodiment 1.

Besides, as shown in an exploded perspective view of other embodiment in which a rubber material that is an elastic body contained with magnetic substance powder is arranged in a dual mode core portion of FIG. 12, a rubber material 21a to a rubber material 21d contained with magnetic substance powder are arranged between a first columnar body 5a and an upper core 6a, between a second columnar body 5b and an upper core 6a, between a third columnar body 5c and an upper core 6b, and between a fourth columnar body 5d and an upper core 6b, respectively. As described above, the rubber materials are compressed by inserting the rubber material 21a to the rubber material 21d contained with magnetic substance powder, whereby a space of each butted portion between the columnar body 5a and the upper core 6a, between the columnar body 5b and the upper core 6a, between the columnar body 5c and the upper core 6b, and between the columnar body 5d and the upper core 6b becomes small and a high inductance can be achieved in a common mode. Furthermore, the rubber materials to be inserted are the rubber materials 21a to 21d contained with magnetic substance powder; however, the rubber material is not limited to this, but it is permissible if the rubber material is material whose relative magnetic permeability exceeds 1 and is a softer substance than the columnar bodies 5a to 5d and the upper cores 6a and 6b.

Figure 13:
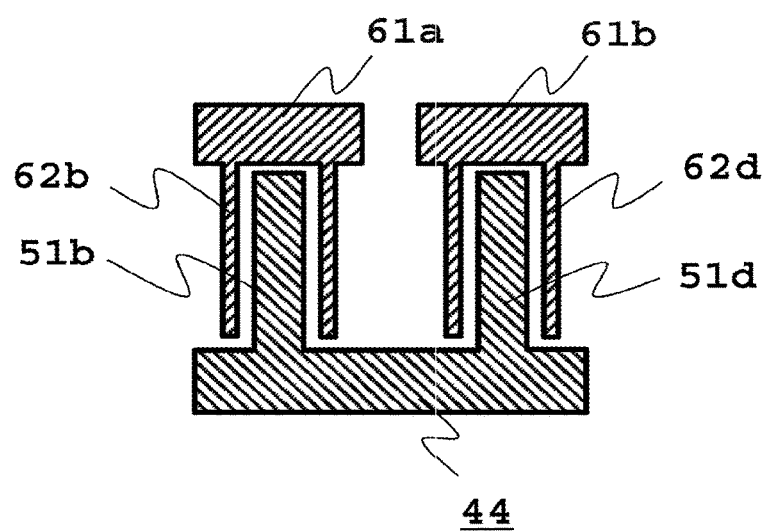
FIG. 13 is a sectional view showing a second embodiment of a dual mode core portion in Embodiment 1.

Furthermore, as shown in a sectional view of a second embodiment of a dual mode core portion in FIG. 13, the structure of the core material of the core portion 2 shown by a section B of FIG. 2 may be changed. Two tubular bodies 62a and 62b integrated with an upper core 61a and two tubular bodies 62c and 62d integrated with an upper core 61b are provided (the tubular bodies 62a and 62c are not shown in the drawing); and the upper core 61a and the upper core 61b are each a body made of a magnetic substance in which two tubular bodies are integrated with a flat plate. A first columnar body 51a to a fourth columnar body 51d of a lower core 44 are fitted into the inside of the tubular body 62a to the tubular body 62d, respectively (the first columnar body 51a and the third columnar body 51c are not shown in the drawing). This increases areas where the upper cores 61a and 61b are brought in contact with the lower core 44, and a high inductance can be achieved in the common mode. Further, the upper cores 61a, 61b are fixed and positioning become easy by inserting coils 3a, 3b into the columnar bodies.

Figure 14:
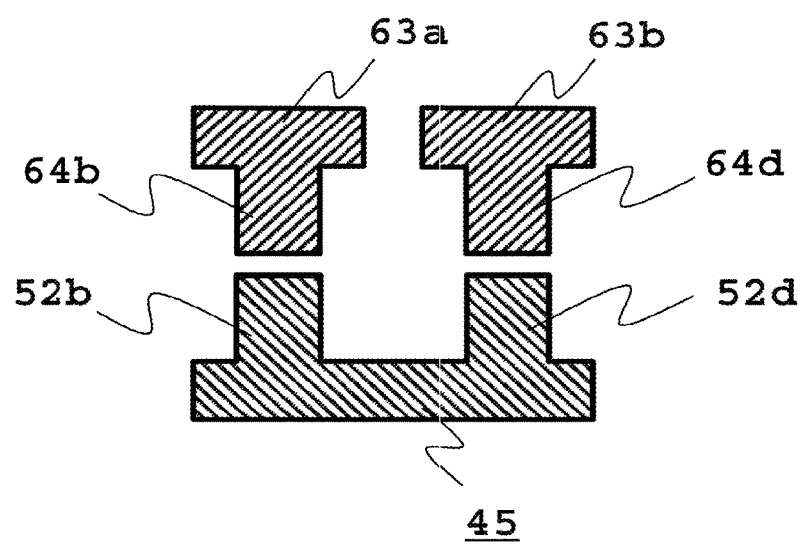
FIG. 14 is a sectional view showing a third embodiment of a dual mode core portion in Embodiment 1.

Moreover, as shown in a sectional view of a third embodiment of a dual mode core portion in FIG. 14, the structure of the core material of the core portion 2 shown by the section B in FIG. 2 may be changed. Two columnar bodies 64a and 64b integrated with an upper core 63a and two columnar bodies 64c and 64d integrated with an upper core 63b are provided (the columnar bodies 64a and 64c are not shown in the drawing); and the upper core 63a and the upper core 63b are each a body made of a magnetic substance in which two columnar bodies are integrated with a flat plate. A columnar body 52a to a columnar body 52d of a lower core 45 are brought in contact with the columnar body 64a to the columnar body 64d, respectively (the columnar bodies 52a and 52c are not shown in the drawing). In this manner, the columnar bodies may be provided on both lower core and upper cores and the same effect as the case of the dual mode core portion shown in FIG. 2 can be obtained.

As described above, according to the dual mode choke coil of Embodiment 1, since the upper core is composed of a plurality of flat plate-shaped bodies made of magnetic substances in the configuration of the dual mode core portion, a plurality of magnetic flux paths can be generated, whereby an effect exists in that a higher inductance for the common mode current and the normal mode current can be achieved than that of the conventional example and the common mode noise and the normal mode noise can be more largely reduced.

Incidentally, the description has been made on the case where the above embodiments use the first coil and the second coil, in which the winding directions of two coil conductors are different, are connected; however, the connection may be made such that magnetic flux directions generated to each other between two coil conductors are different during energization irrespective of the winding directions of two coil conductors.

Embodiment 2

Figure 15:
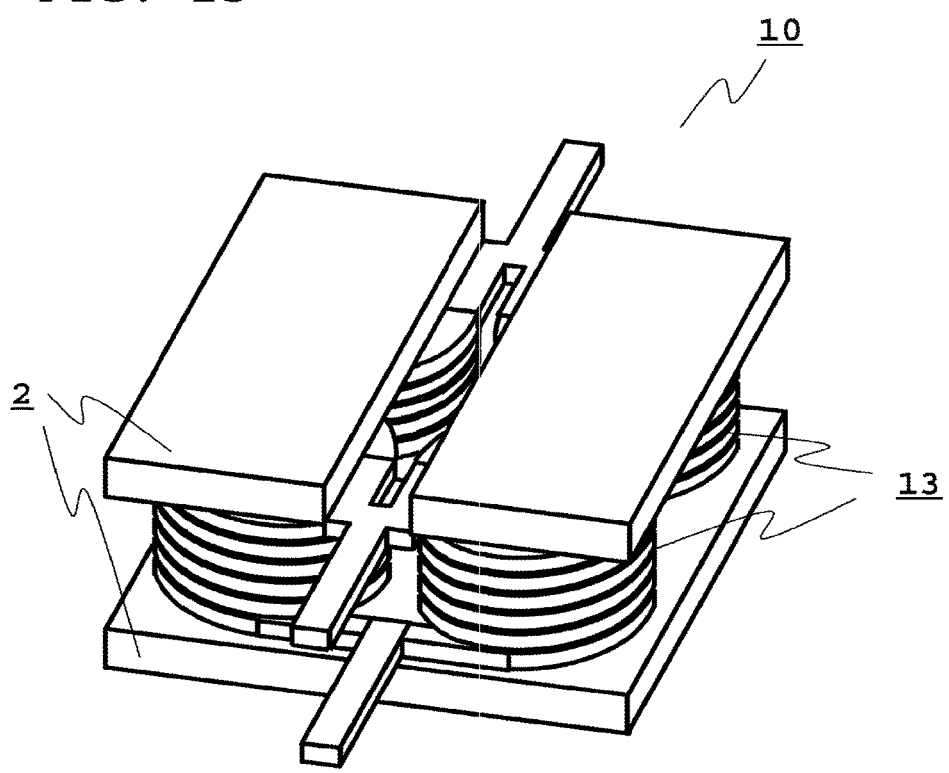
FIG. 15 is a perspective view showing the entire configuration of a dual mode choke coil according to Embodiment 2.
Figure 16:
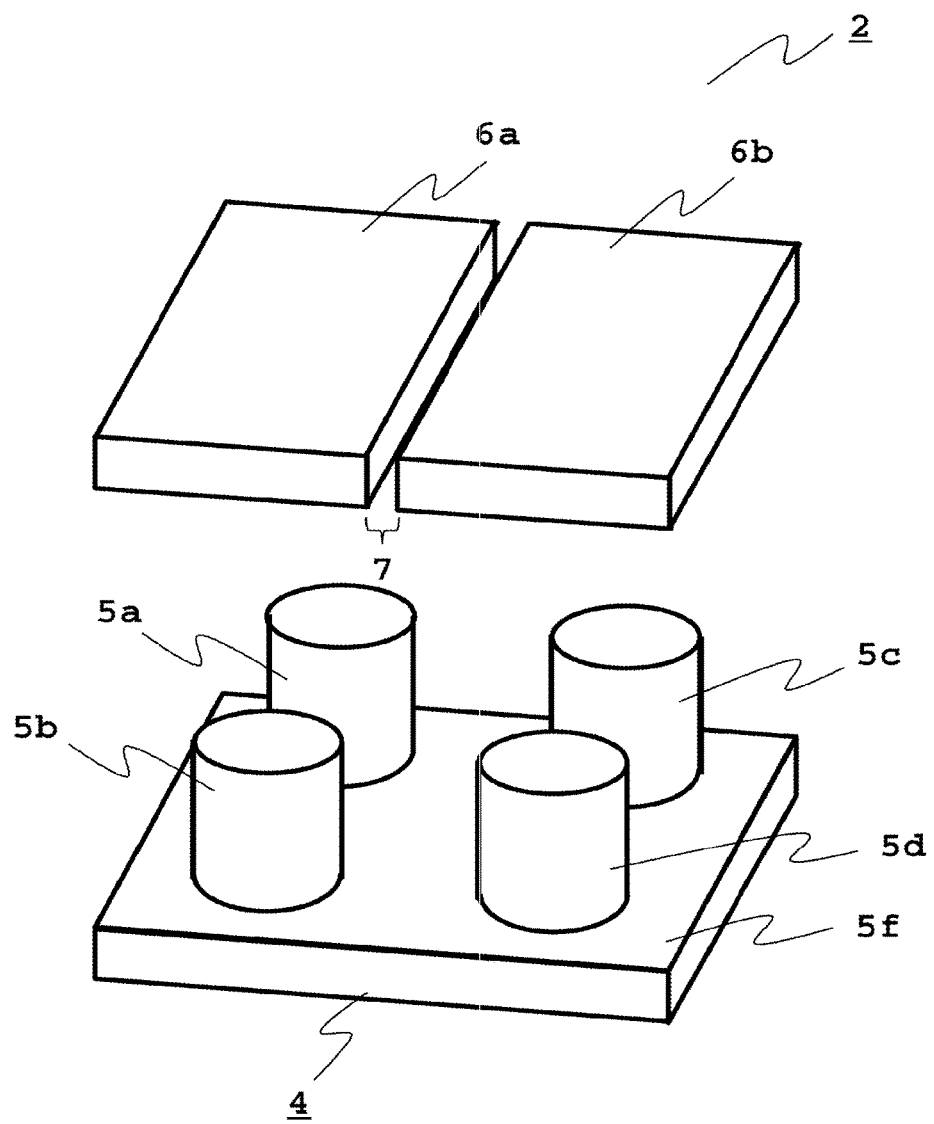
FIG. 16 is an exploded perspective view of a dual mode core portion in Embodiment 2.
Figure 17:
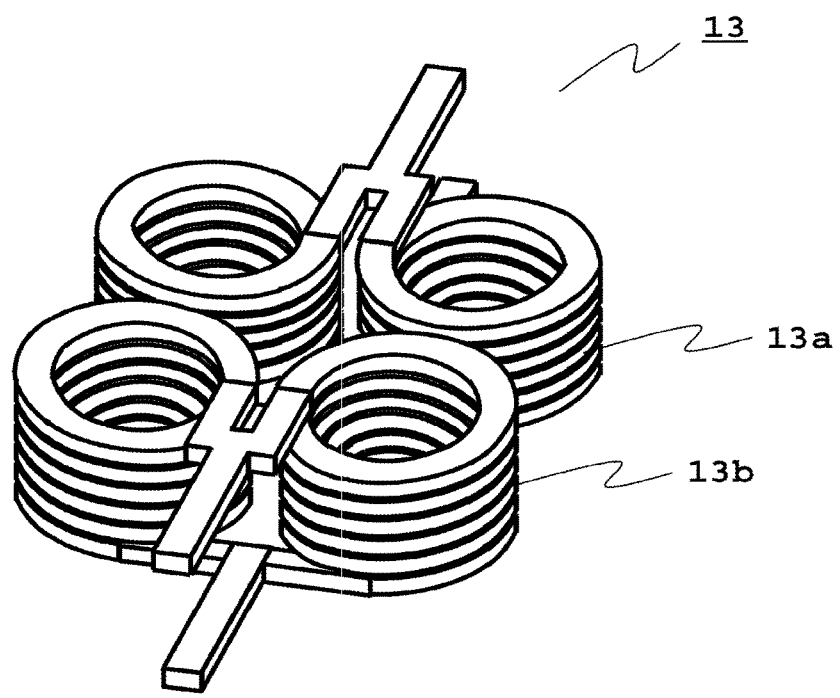
FIG. 17 is a perspective view showing a coil portion in Embodiment 2.

FIG. 15 is a perspective view showing the entire configuration of a dual mode choke coil according to Embodiment 2; FIG. 16 is an exploded perspective view of a dual mode core portion; and FIG. 17 is a perspective view of a coil portion. As shown in FIG. 17, a difference from the dual mode choke coil 1 according to Embodiment 1 is that the configuration of a coil portion 13 is different.

First, the entire configuration of the dual mode choke coil according to Embodiment 2 will be described by using FIG. 15 to FIG. 17. As shown in FIG. 15, a dual mode choke coil 10 is composed of a dual mode core portion 2 and a coil portion 13. As shown in FIG. 16, since the configuration of the dual mode core portion 2 is the same as that of Embodiment 1, their description will be omitted. Furthermore, as shown in FIG. 17, the coil portion 13 includes: a first coil 13a in which two coil conductors are connected in parallel, each of two coil conductors being wound around a first columnar body 5a and a third columnar body 5c so that magnetic flux directions generated to each other are reversed; and a second coil 13b in which two coil conductors are connected in parallel, each of two coil conductors being wound around a second columnar body 5b and a fourth columnar body 5d so that magnetic flux directions generated to each other are reversed, two coil conductors being arranged so that the magnetic flux direction generated by the coil conductor wound around the first columnar body 5a is the same as the magnetic flux direction generated by the coil conductor wound around the second columnar body 5b.

Figure 18:
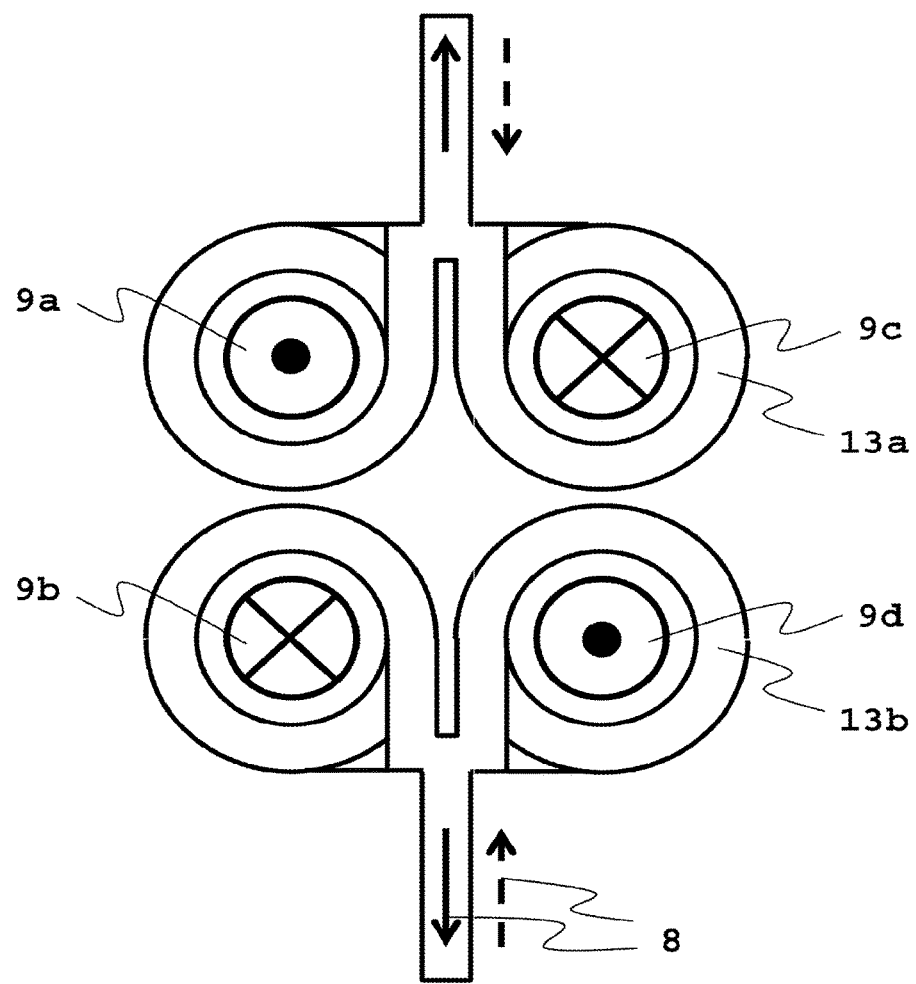
FIG. 18 is a view for a common mode current, the view being seen from the top of the coil portion in Embodiment 2.

Next, operation for a common mode current of the dual mode choke coil 10 in Embodiment 2 will be described by using FIG. 18.

FIG. 17 is a top view of the first coil 13a and the second coil 13b and shows a common mode current direction and a magnetic flux direction generated when the common mode current flows. In FIG. 18, arrows 8 show the directions of current flow; a solid line arrow shows a current direction at an input/output end part of the first coil 13a and the second coil 13b on the front side of the page space; and a dashed line arrow shows a current direction at the input/output end part of the first coil 13a and the second coil 13b on the deep side of the page space. Furthermore, a magnetic flux direction 9a to a magnetic flux direction 9d show the magnetic flux directions generated in the first columnar body 5a to the fourth columnar body 5d, respectively. As is apparent from FIG. 18, the magnetic flux direction 9a to the magnetic flux direction 9d generated in the first columnar body 5a to the fourth columnar body 5d, respectively, are the same as the case where the common mode current flows in the dual mode choke coil 1 according to Embodiment 1 shown in FIG. 5. Therefore, the magnetic flux generated by the common mode current in the dual mode core portion 2 is the same as the magnetic flux directions shown in FIG. 6 and FIG. 7; as a result, similarly to the dual mode choke coil 1 according to Embodiment 1, the dual mode choke coil 10 according to Embodiment 2 can achieve a higher inductance for the common mode current than that of the conventional example.

Subsequently, operation for a normal mode current of the dual mode choke coil 10 in Embodiment 2 will be described by using FIG. 19.

Figure 19:
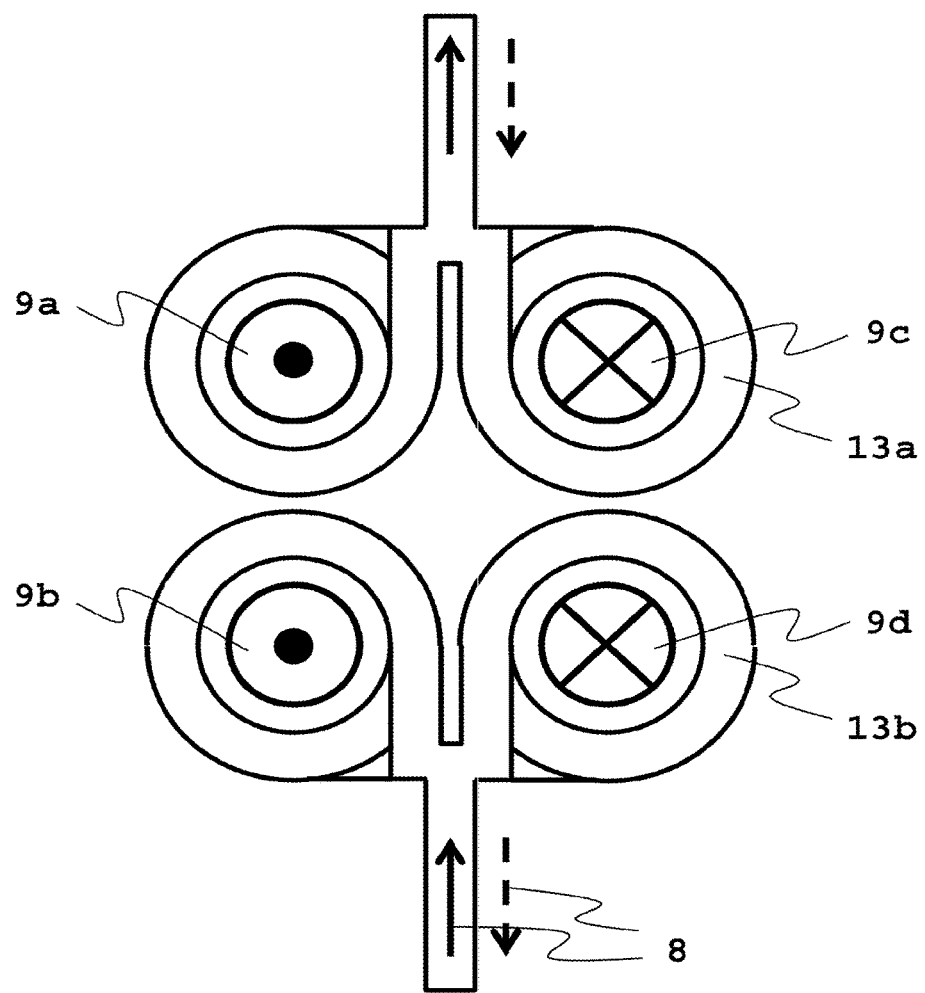
FIG. 19 is a view for a normal mode current, the view being seen from the top of the coil portion in Embodiment 2.

FIG. 19 is a top view of the first coil 13a and the second coil 13b and shows a normal mode current direction and a magnetic flux direction generated when the normal mode current flows. In FIG. 19, arrows 8 show the directions of current flow; a solid line arrow shows a current direction at an input/output end part of the first coil 13a and the second coil 13b on the front side of the page space; and a dashed line arrow shows a current direction at the input/output end part of the first coil 13a and the second coil 13b on the deep side of the page space. Furthermore, a magnetic flux direction 9a to a magnetic flux direction 9d show the magnetic flux directions generated in the first columnar body 5a to the fourth columnar body 5d, respectively. As is apparent from FIG. 19, the magnetic flux direction 9a to the magnetic flux direction 9d generated in the first columnar body 5a to the fourth columnar body 5d, respectively, are the same as the case where the normal mode current flows in the dual mode choke coil 1 according to Embodiment 1 shown in FIG. 8. Therefore, the magnetic flux generated by the normal mode current in the dual mode core portion 2 is the same as the magnetic flux directions shown in FIG. 9 and FIG. 10; as a result, similarly to the dual mode choke coil 1 according to Embodiment 1, the dual mode choke coil 10 according to Embodiment 2 can achieve a higher inductance for the normal mode current than that of the conventional example.

Further, since two coil conductors are connected in parallel in the dual mode choke coil 10 according to Embodiment 2, the amount of current flowing in the coil conductors wound around the first columnar body 5a to the fourth columnar body 5d becomes about half that of Embodiment 1, the amount of current being relative to an input current of the same magnitude. Therefore, in the case of the same amount of current, the sectional area of the coil conductor of the coil portion 13 can be reduced as compared to the sectional area of the coil portion 3 of the dual mode choke coil according to Embodiment 1, the entire component size can be miniaturized as compared to that of the dual mode choke coil 1 according to Embodiment 1 and the formation of the winding structure of the coil portion becomes easy.

As described above, according to the dual mode choke coil according to Embodiment 2, since the same effect as that of Embodiment 1 is exhibited and two coil conductors that constitute each coil are connected in parallel, an effect exists in that the sectional area of the coil conductor can be reduced, the formation of the winding structure of the coil portion becomes easy, the entire size of the dual mode choke coil can be miniaturized.

Embodiment 3

Figure 20:
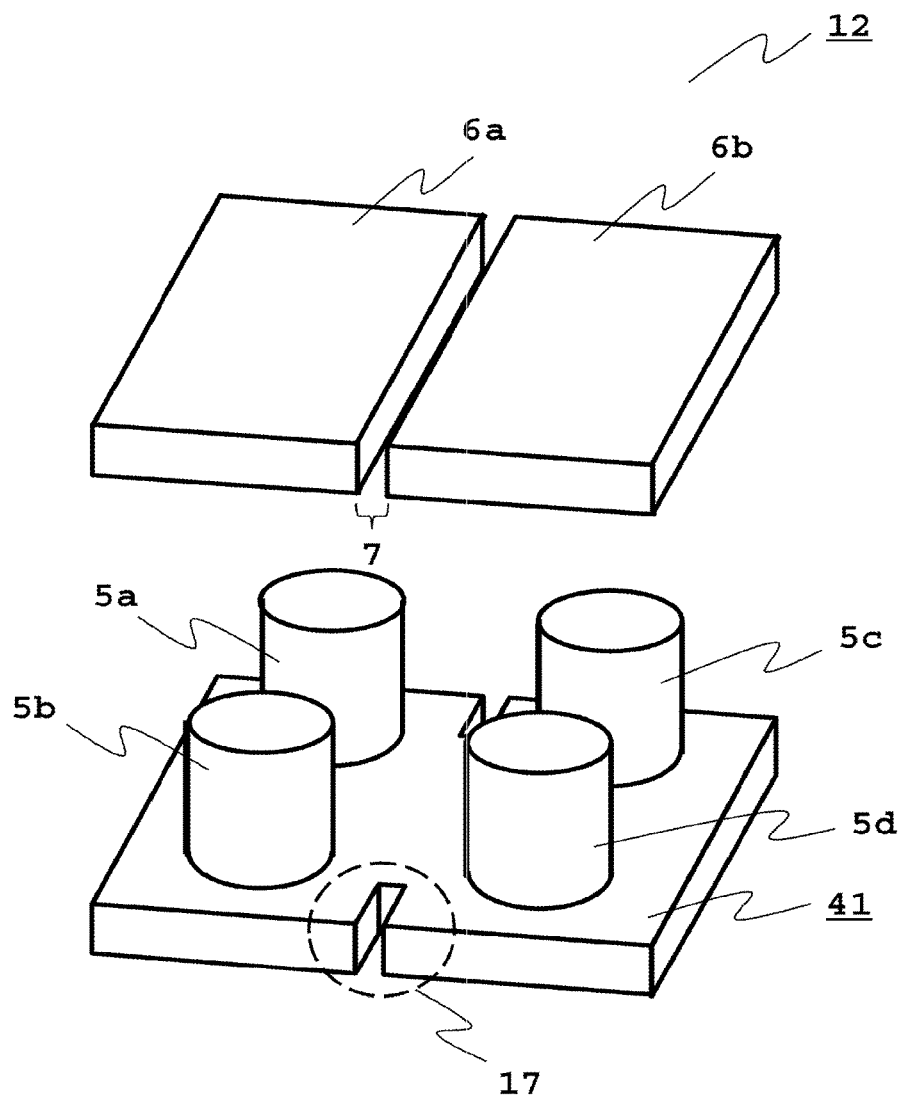
FIG. 20 is an exploded perspective view of a dual mode core portion in a dual mode choke coil according to Embodiment 3.

FIG. 20 is an exploded perspective view of a dual mode core portion in a dual mode choke coil according to Embodiment 3. A difference from the dual mode choke coil 1 according to Embodiment 1 is that a cut part 17 is formed in a lower core 41 of a dual mode core portion 12 at a part of the side between a first columnar body 5a and a third columnar body 5c and at a part of the side between a second columnar body 5b and a fourth columnar body 5d, the cut parts 17 being formed in a direction parallel to a gap 7. Since other configuration is the same as that of Embodiment 1, their description will be omitted.

Figure 21:
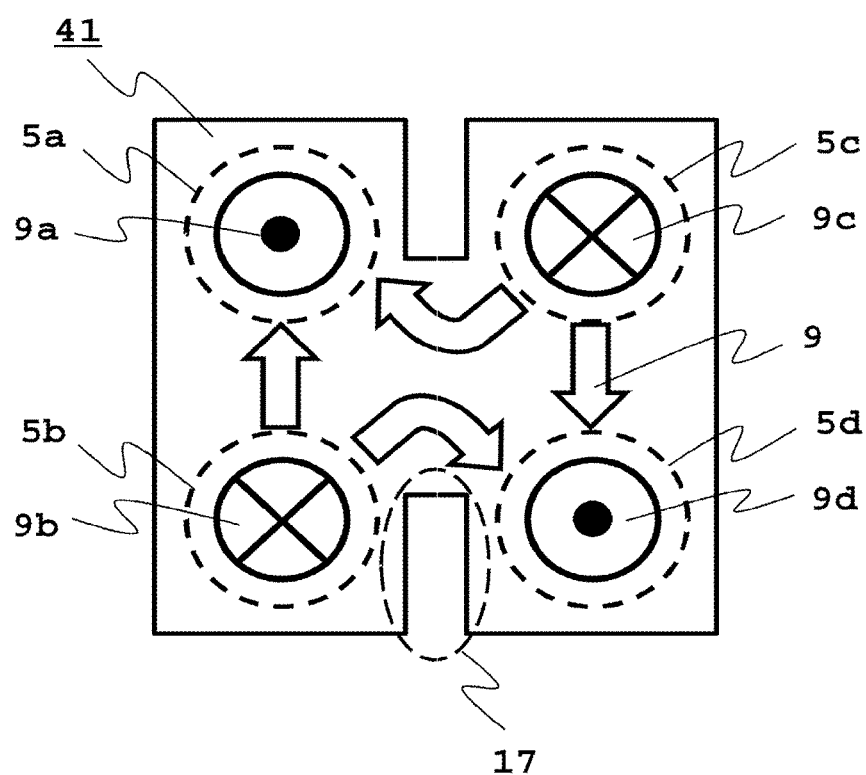
FIG. 21 is a view for a common mode current, the view being seen from the top of a lower core in Embodiment 3.
Figure 22:
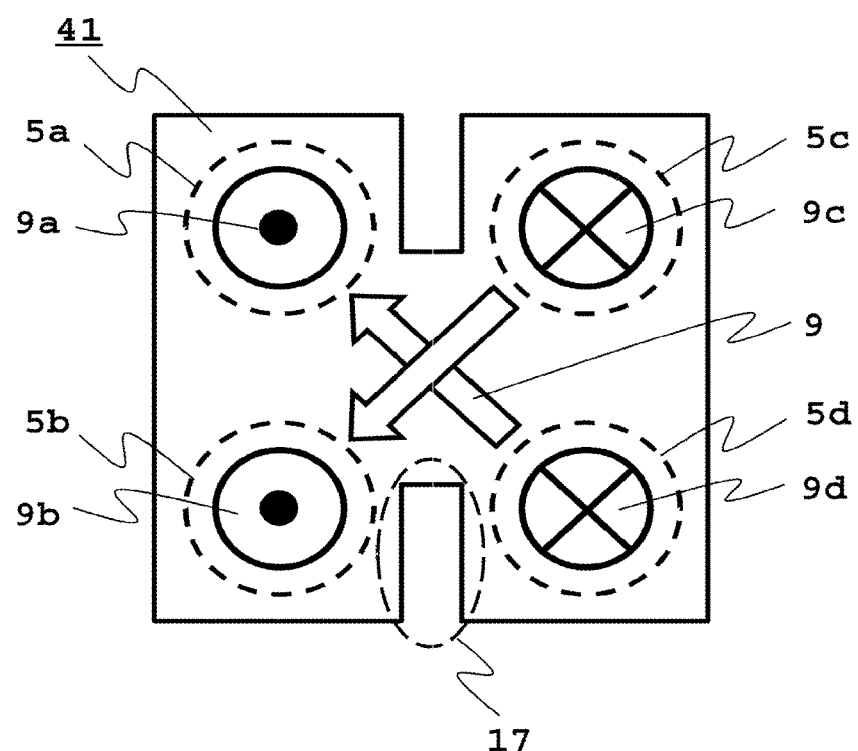
FIG. 22 is a view for a normal mode current, the view being seen from the top of the lower core in Embodiment 3.

Magnetic flux of the lower core 41 relative to a common mode current is shown in FIG. 21 and relative to a normal mode current is shown in FIG. 22. As is apparent from magnetic flux directions 9 shown in FIG. 21 and FIG. 22, as compared to the magnetic flux directions 9 shown in FIG. 7 and FIG. 10, a magnetic flux path between the first columnar body 5a and the third columnar body 5c and a magnetic flux path between the second columnar body 5b and the fourth columnar body 5d are changed by the presence of the cut parts 17. More specifically, common mode magnetic flux and normal mode magnetic flux generated in the lower core 41 can be adjusted by the cut parts 17; and as a result, common mode inductance and normal mode inductance of the dual mode choke coil can be adjusted.

As described above, according to the dual mode choke coil according to Embodiment 3, the cut parts are formed at the part of both sides of the lower core in the direction parallel to the gap between upper cores, whereby an effect exists in that the common mode inductance and the normal mode inductance can be adjusted.

Embodiment 4

Figure 23:
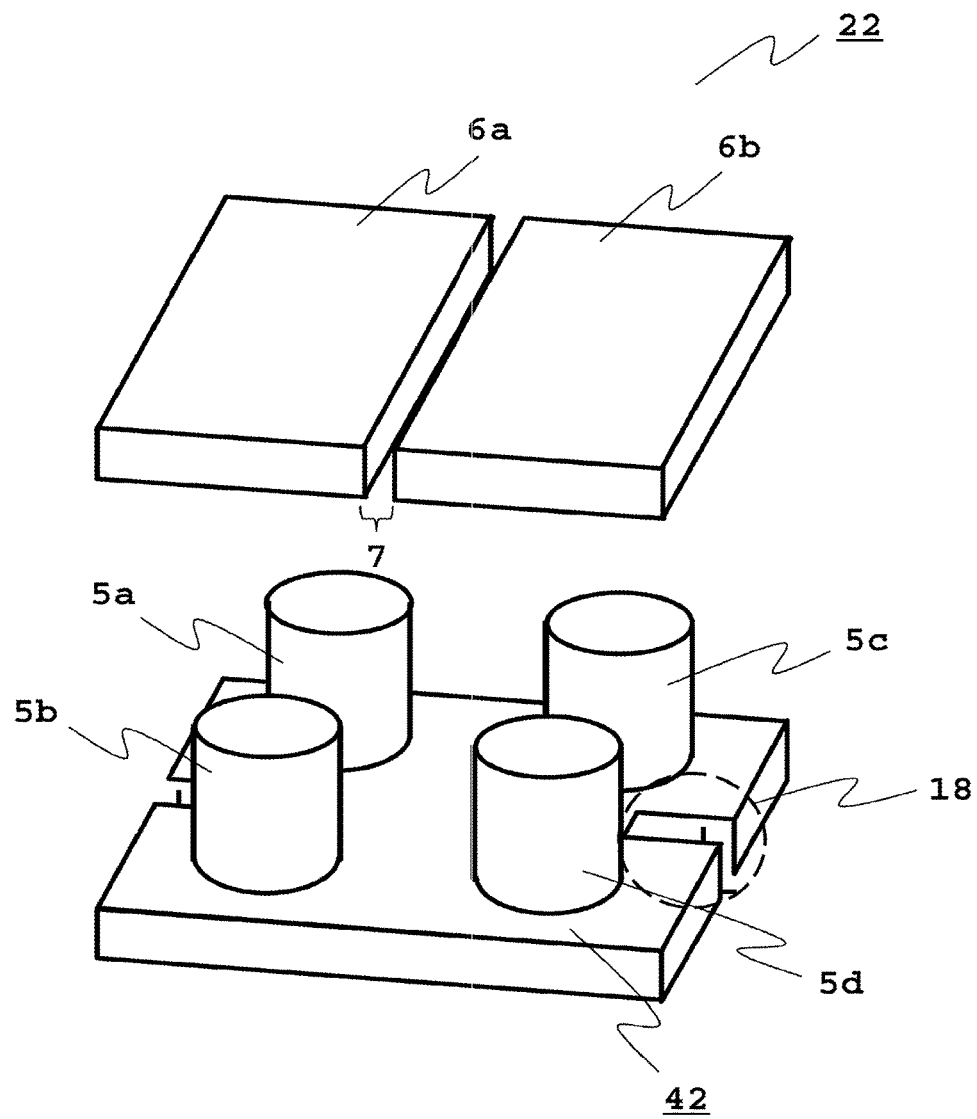
FIG. 23 is an exploded perspective view of a dual mode core portion in a dual mode choke coil according to Embodiment 4.

FIG. 23 is an exploded perspective view of a dual mode core portion in a dual mode choke coil according to Embodiment 4. A difference from the dual mode choke coil 1 according to Embodiment 1 is that a cut part 18 is formed in a lower core 42 of a dual mode core portion 22 at a part of the side between a first columnar body 5a and a second columnar body 5b and at a part of the side between a third columnar body 5c and a fourth columnar body 5d, the cut parts 18 being formed in a direction perpendicular to a gap 7. Since other configuration is the same as that of Embodiment 1, their description will be omitted.

Figure 24:
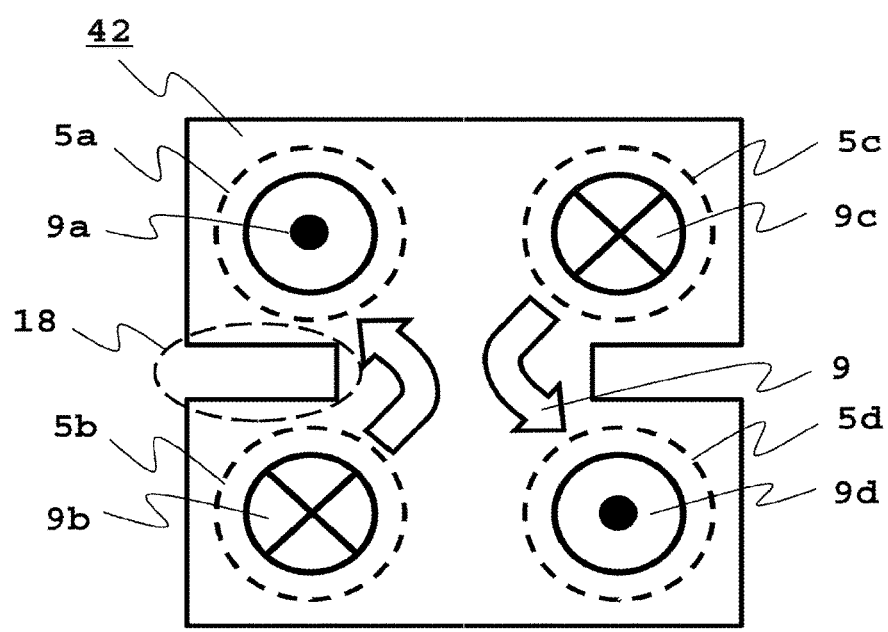
FIG. 24 is a view for a common mode current, the view being seen from the top of a lower core in Embodiment 4.
Figure 25:
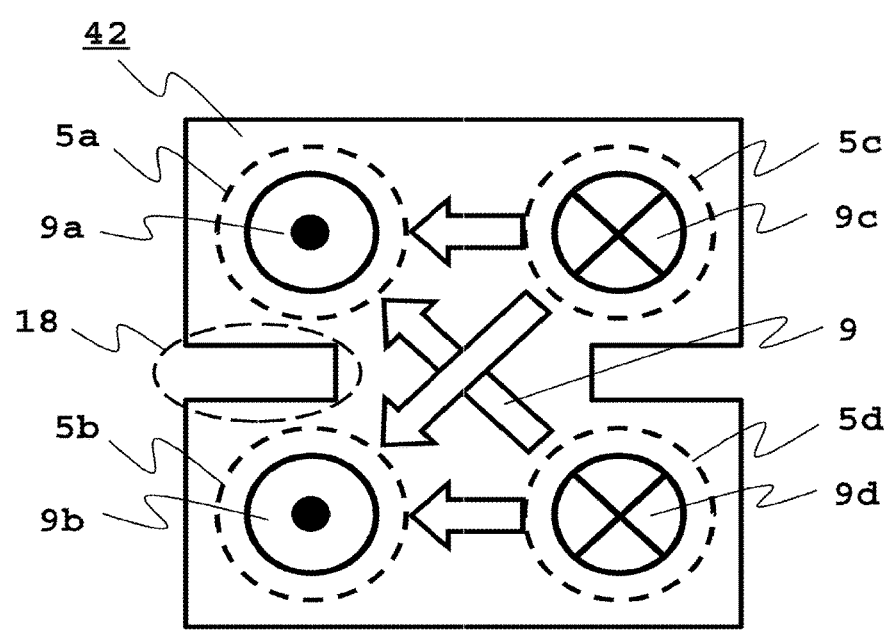
FIG. 25 is a view for a normal mode current, the view being seen from the top of the lower core in Embodiment 4.

Magnetic flux of the lower core 42 relative to a common mode current is shown in FIG. 24 and relative to a normal mode current is shown in FIG. 25. As is apparent from magnetic flux directions 9 shown in FIG. 24 and FIG. 25, as compared to the magnetic flux directions 9 shown in FIG. 7 and FIG. 10, a magnetic flux path between the first columnar body 5a and the second columnar body 5b and a magnetic flux path between the third columnar body 5c and the fourth columnar body 5d are changed by the presence of the cut parts 18. Here, since the normal mode magnetic flux is not generated between the first columnar body 5a and the second columnar body 5b and between the third columnar body 5c and the fourth columnar body 5d in Embodiment 1, only common mode magnetic flux is influenced by the cut parts 18 in Embodiment 4, different from Embodiment 3. More specifically, only the common mode magnetic flux generated in the lower core 42 can be adjusted by the cut parts 18; and as a result, only common mode inductance of the dual mode choke coil can be adjusted.

As described above, according to the dual mode choke coil according to Embodiment 4, the cut parts are formed at the part of both sides of the lower core in the direction perpendicular to the gap between upper cores, whereby an effect exists in that only the common mode inductance can be adjusted.

Embodiment 5

Figure 26:
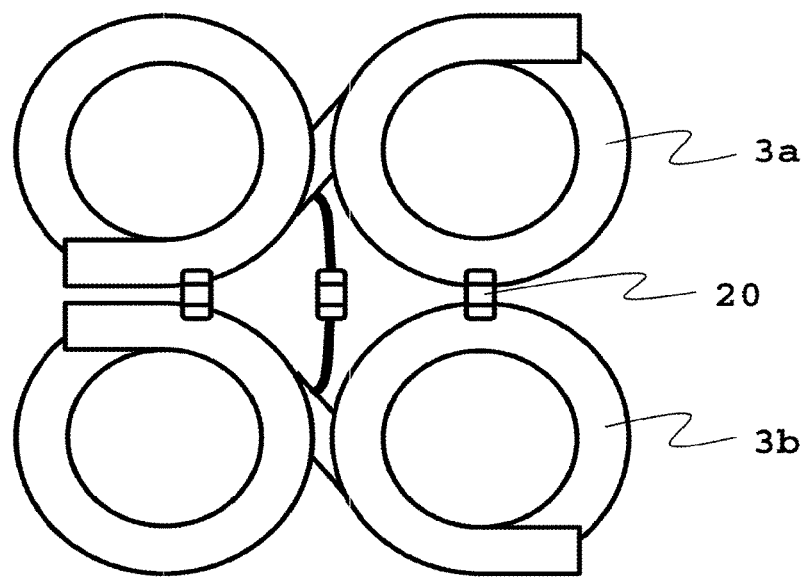
FIG. 26 is a view seen from the top of a coil portion of a high frequency filter according to Embodiment 5.
Figure 27:
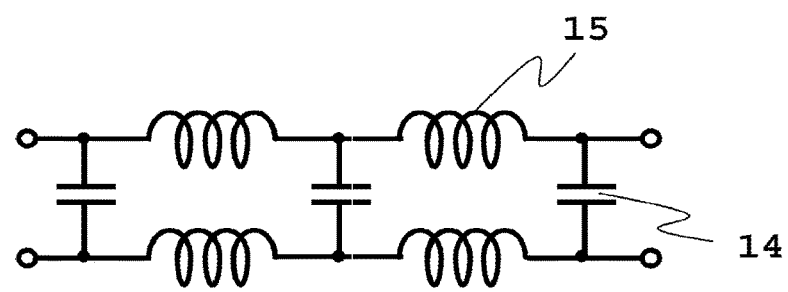
FIG. 27 is an equivalent circuit diagram in Embodiment 5.

FIG. 26 is a view seen from the top of a coil portion of a high frequency filter according to Embodiment 5 and FIG. 27 is an equivalent circuit diagram thereof. As shown in FIG. 26, the high frequency filter according to Embodiment 5 is such that three chip capacitors 20 are connected between the first coil 3a and the second coil 3b of the dual mode choke coil 1 according to Embodiment 1. Since the configuration of the dual mode choke coil is the same as that of Embodiment 1, their will be omitted.

In FIG. 27, reference numeral 14 denotes a capacitance circuit; and 15 denotes a normal mode choke circuit. In FIG. 27, a high frequency filter circuit is configured such that the capacitance circuit 14 and the normal mode choke circuit 15 are alternately connected between the first coil 3a and the second coil 3b to provide a circuit configuration with a high reduction effect for a normal mode noise current.

More specifically, the high frequency filter according to Embodiment 5 uses the dual mode choke coil 1 according to Embodiment 1 and can configure the high frequency filter with the high reduction effect for the normal mode noise current.

Incidentally, the description has been made on the case where three chip capacitors are used as the capacitance circuits in the high frequency filter according to Embodiment 5; however, if the circuit is a capacitive circuit, the configuration of the components is not limited to the chip capacitors and the number of pieces is not limited to three.

As described above, according to the high frequency filter according to Embodiment 5, the dual mode choke coil is used as the normal mode choke coil that has the reduction effect of the normal mode noise current and the capacitance circuit is added between a pair of coils thereof, whereby an effect exists in that the high frequency filter corresponding to a high frequency of the normal mode noise current can be achieved.

Embodiment 6

Figure 28:
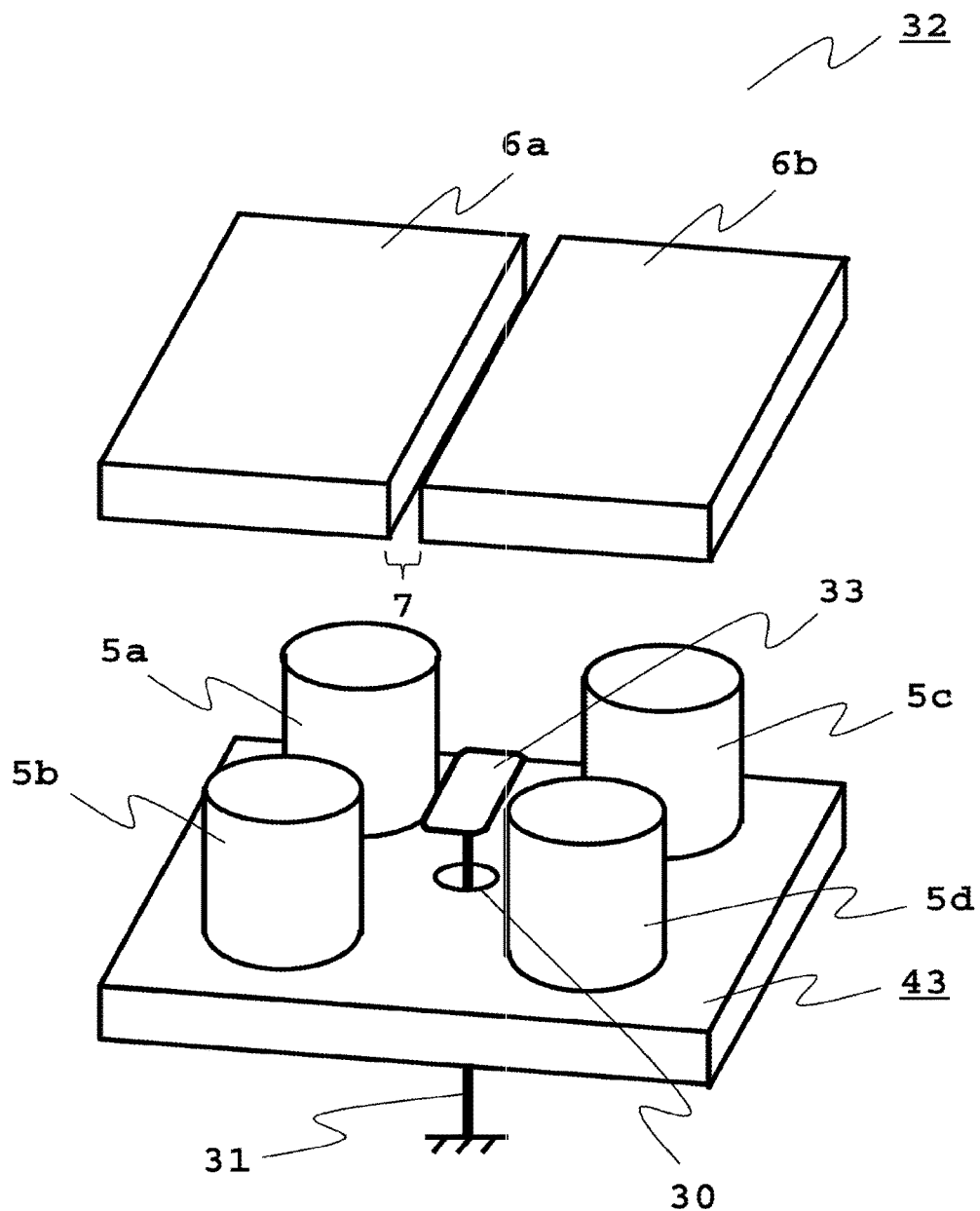
FIG. 28 is an exploded perspective view of a dual mode core portion in a high frequency filter according to Embodiment 6.
Figure 29:
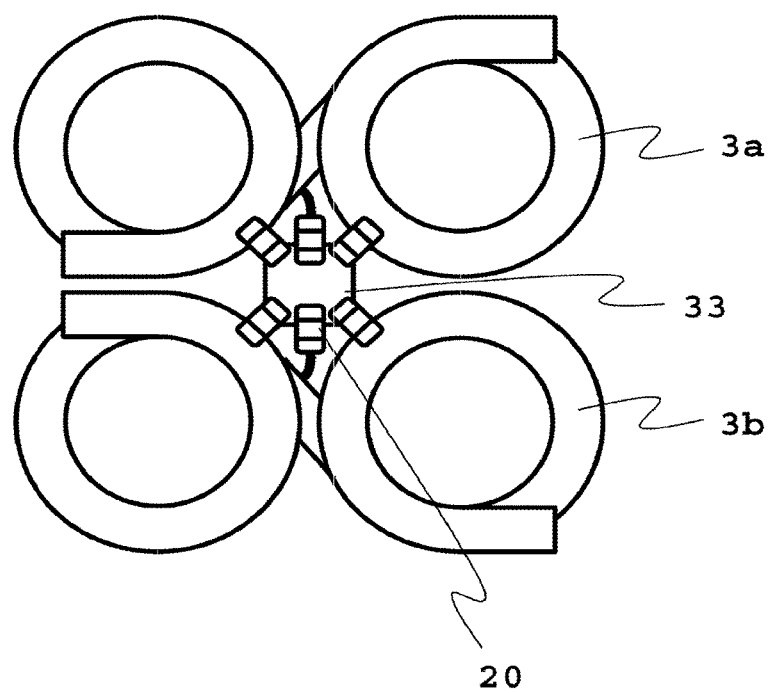
FIG. 29 is a view seen from the top of a coil portion in Embodiment 6.
Figure 30:
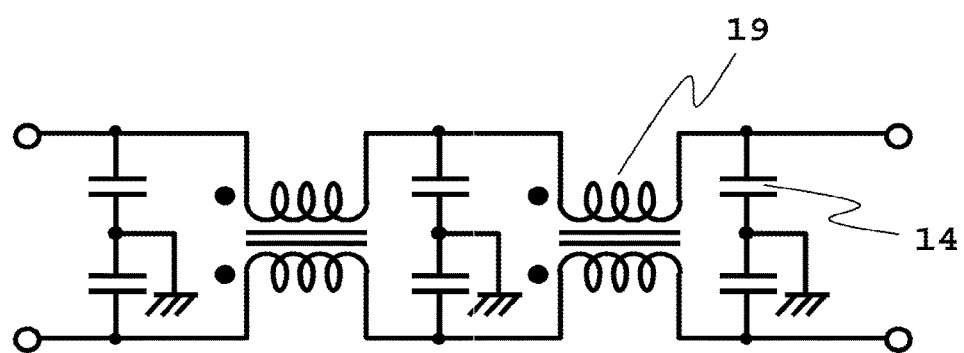
FIG. 30 is an equivalent circuit diagram in Embodiment 6.

FIG. 28 is an exploded perspective view of a dual mode core portion in a high frequency filter according to Embodiment 6. FIG. 29 is a view seen from the top of a coil portion and FIG. 30 is an equivalent circuit diagram thereof. As shown in FIG. 28 and FIG. 29, the high frequency filter according to Embodiment 6 is provided with: a through hole 30 that passes through a lower core 43 of a dual mode core portion 32; and an earth terminal 33 to be earthed by an earth wire 31 that passes through a through hole 30. Then, six chip capacitors 20 are connected between the first coil 3a and the second coil 3b via the earth terminal 33. Since the configuration of the dual mode choke coil is the same as Embodiment 1, their description will be omitted.

In FIG. 30, reference numeral 14 denotes a capacitance circuit; and 19 denotes a common mode choke circuit. In FIG. 30, a high frequency filter circuit is configured such that the capacitance circuit 14 and the common mode choke circuit 15 are alternately connected between the first coil 3a and the wire earth and between the second coil 3b and the wire earth to provide a circuit configuration with a high reduction effect for a common mode noise current.

More specifically, the high frequency filter according to Embodiment 6 uses the dual mode choke coil 1 according to Embodiment 1 and can configure the high frequency filter with the high reduction effect for the common mode noise current.

Incidentally, the description has been made on the case where six chip capacitors are used as a capacitance circuits in the high frequency filter of Embodiment 6; however, if the circuit is a capacitive circuit, the configuration of the components is not limited to the chip capacitors and the number of pieces is not limited to six.

Furthermore, in the high frequency filter of Embodiment 6, the earth wire 31 passes through the through hole 30 provided in the lower core 43 of the dual mode core portion 32; however, if the earth can be made by the earth terminal 33, the through hole 30 is not necessarily provided to pass the earth wire 31 therethrough, but the earth wire 31 may pass through between the first upper core 6a and the lower core 4 and between the second upper core 6b and the lower core 4.

As described above, according to the high frequency filter according to Embodiment 6, the dual mode choke coil is used as the common mode choke coil that has the reduction effect for the common mode noise current and the capacitance circuit is added between a pair of coils via the earth terminal, whereby an effect exists in that the high frequency filter corresponding to a high frequency of the common mode noise current can be achieved.

Embodiment 7

Figure 31:
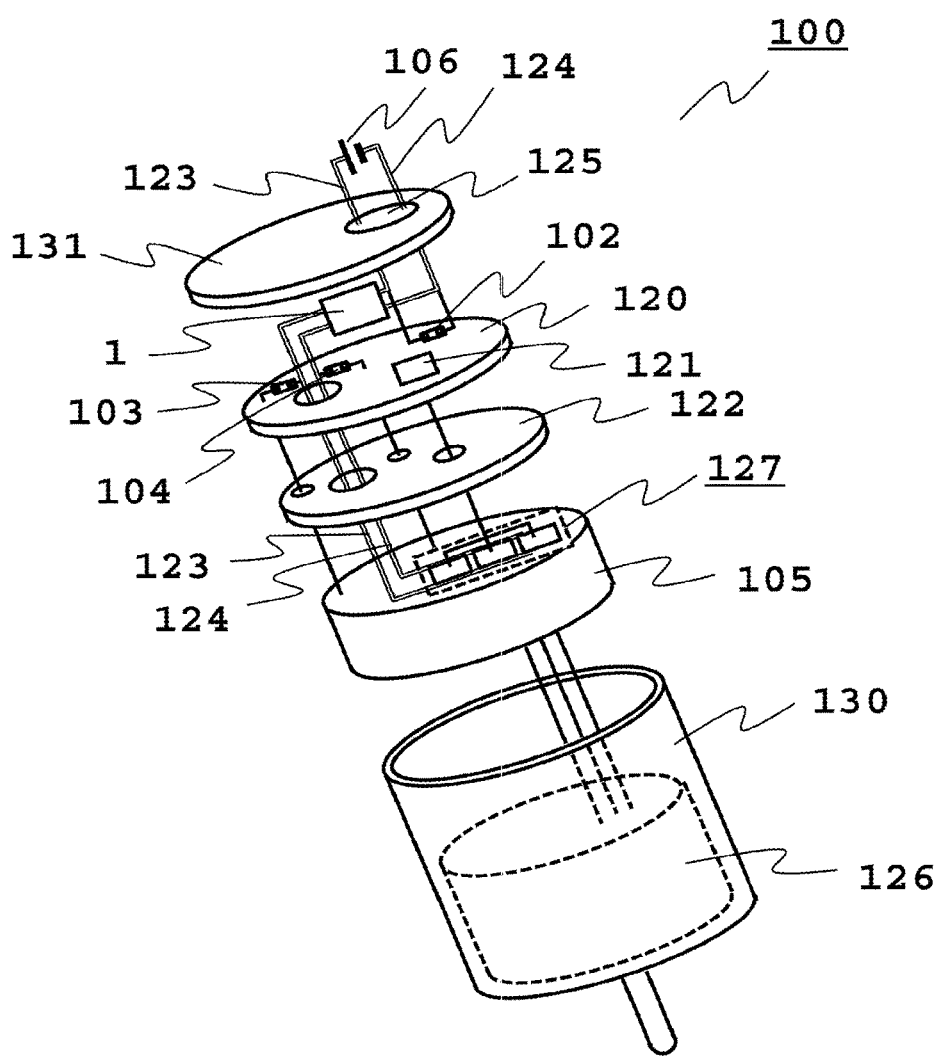
FIG. 31 is an exploded perspective view of an on-board motor integrated electric power steering according to Embodiment 7.
Figure 32:
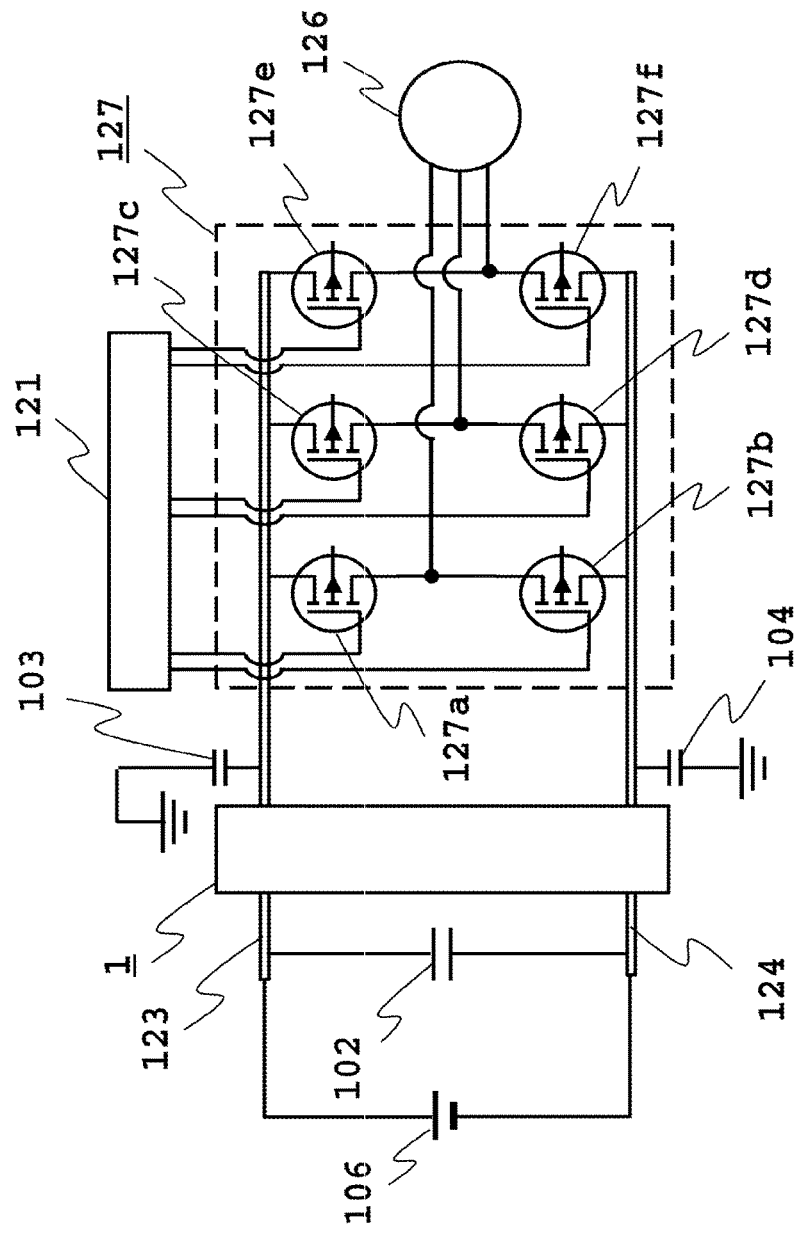
FIG. 32 is a schematic circuit diagram of an EPS in Embodiment 7.

FIG. 31 is an exploded perspective view showing an on-board motor integrated electric power steering (hereinafter, referred to as an "EPS") according to Embodiment 7. FIG. is a schematic circuit diagram of the EPS. In Embodiment 7, a dual mode choke coil is equipped as a noise filter in the EPS.

As shown in FIG. 31, a DC power source 106 to which DC power is supplied by a positive side wire 123 and a negative side wire 124 is connected to an EPS 100 stored in a housing 130.

The EPS 100 includes: a capacitor 102 connected between the positive side wire 123 and the negative side wire 124, which are introduced via a connector 125 of a housing cover 131; a dual mode choke coil 1 connected to the positive side wire 123 and to the negative side wire 124; a capacitor 103 earthed between the positive side wire 123 and the earth (the housing 130); a capacitor 104 earthed between the negative side wire 124 and the earth; an inverter circuit 127 which is provided on a heat sink 105 and converts DC power into three phase AC power; a microcomputer 121 provided on a control substrate 120 that controls the inverter circuit 127; an insulating substrate 122 that intervenes between the control substrate 120 and the heat sink 105; and a motor 126 that is driven by AC outputted from the inverter circuit 127. Here, the dual mode choke coil 1, the control substrate 120, the insulating substrate 122, the heat sink 105, and the motor 126 are stored in the housing 130.

Next, a circuit of the EPS 100 will be described. The dual mode choke coil 1 is provided between the DC power source 106 and the inverter circuit 127 and is connected to the inverter circuit 127. The inverter circuit 127 is composed of: a pair of metal oxide semiconductor field effect transistors (MOSFETs) for u-phase output 127a, 127b; a pair of MOSFETs for v-phase output 127c, 127d; and a pair of MOSFETs for w-phase output 127e, 127f. Then, the inverter circuit 127 converts DC power into three phase AC power by the controlling microcomputer 121. The motor 126 is driven by the converted AC power.

The MOSFETs 127a to 127f perform switching operation by control signals of the microcomputer 121. Decoupling is performed by the dual mode choke coil 1 and the capacitor 102 and this functions as the noise filter, thereby reducing conduction noise generated associated with the switching operation.

By International Special Committee on Radio Interference (CISPR), recommended values of limited values of radio interference waves in frequency bands of 150 kHz to 1,000 MHz for on-board receiver protection are specified by Standard CISPR 25. Since the frequency of the switching operation of the inverter circuit 127 in this embodiment is, for example, 20 kHz, a target is the conduction noise of harmonics which are more than or equal to eight times as large as 20 kHz, which becomes equal to or higher than 150 kHz, and these are required to be reduced.

Since the EPS 100 is mounted on an automobile, the conduction noise must not influence on hearing of a car radio. 150 kHz to 1.5 MHz are frequencies for use in the car radio and are frequency bands that are strongly required to reduce the conduction noise by automobile makers. In this embodiment, the dual mode choke coil 1 is used as the noise filter of the EPS 100; and thus the conduction noise can be considerably reduced in frequency bands equal to or lower than 1.5 MHz at which the conduction noise becomes the largest and therefore the influence on the hearing of the car radio can be reduced.

As described above, according to the EPS according to Embodiment 7, in order to reduce the conduction noise associated with the switching operation of the inverter circuit that drives the motor, the dual mode choke coil is equipped as the noise filter; and thus, an effect exists in that the conduction noise can be considerably reduced in the frequency bands equal to or lower than 1.5 MHz.

Embodiment 8

Figure 33:
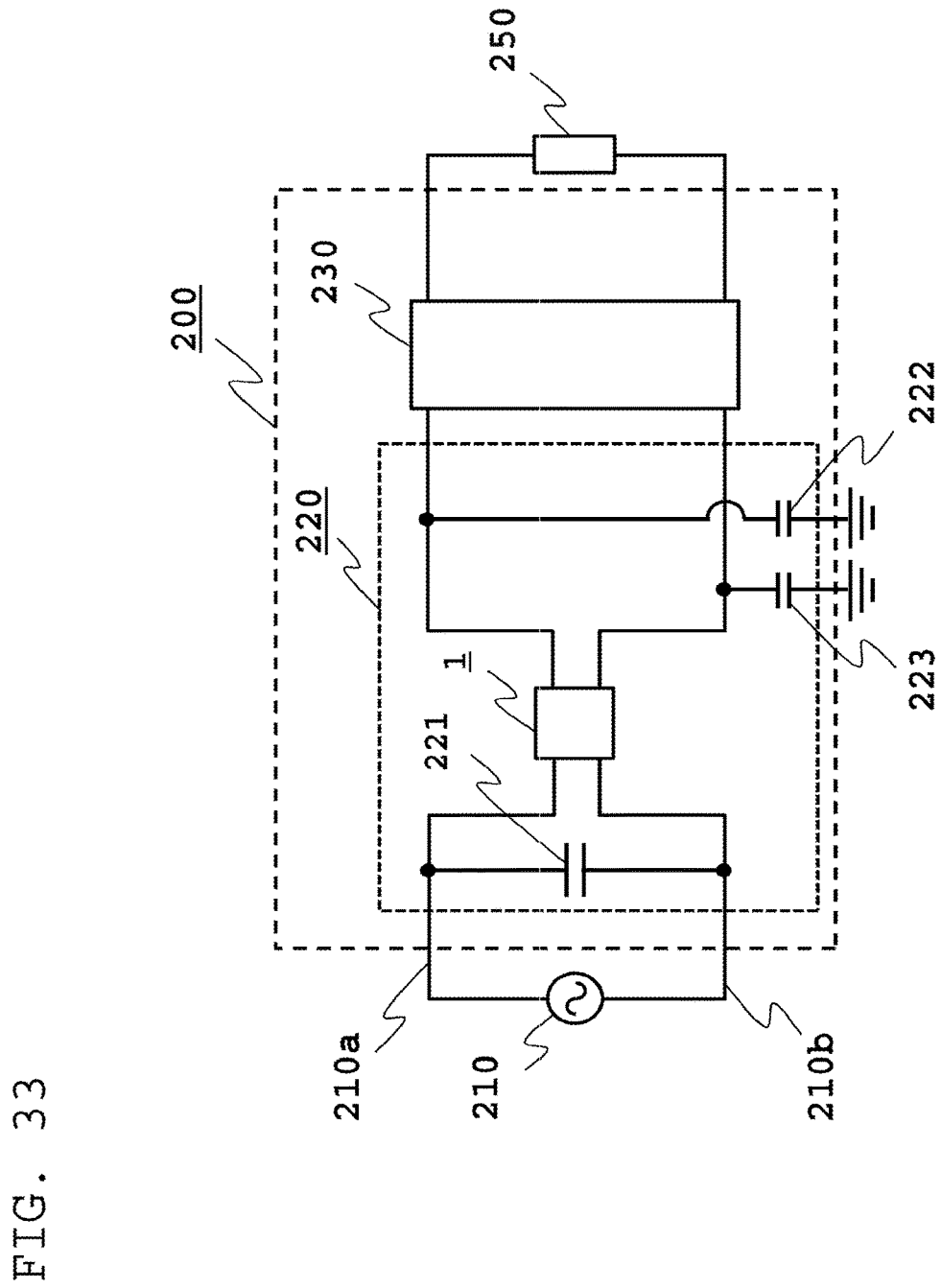
FIG. 33 is a schematic circuit diagram of an on-board charging device according to Embodiment 8.
Figure 34:
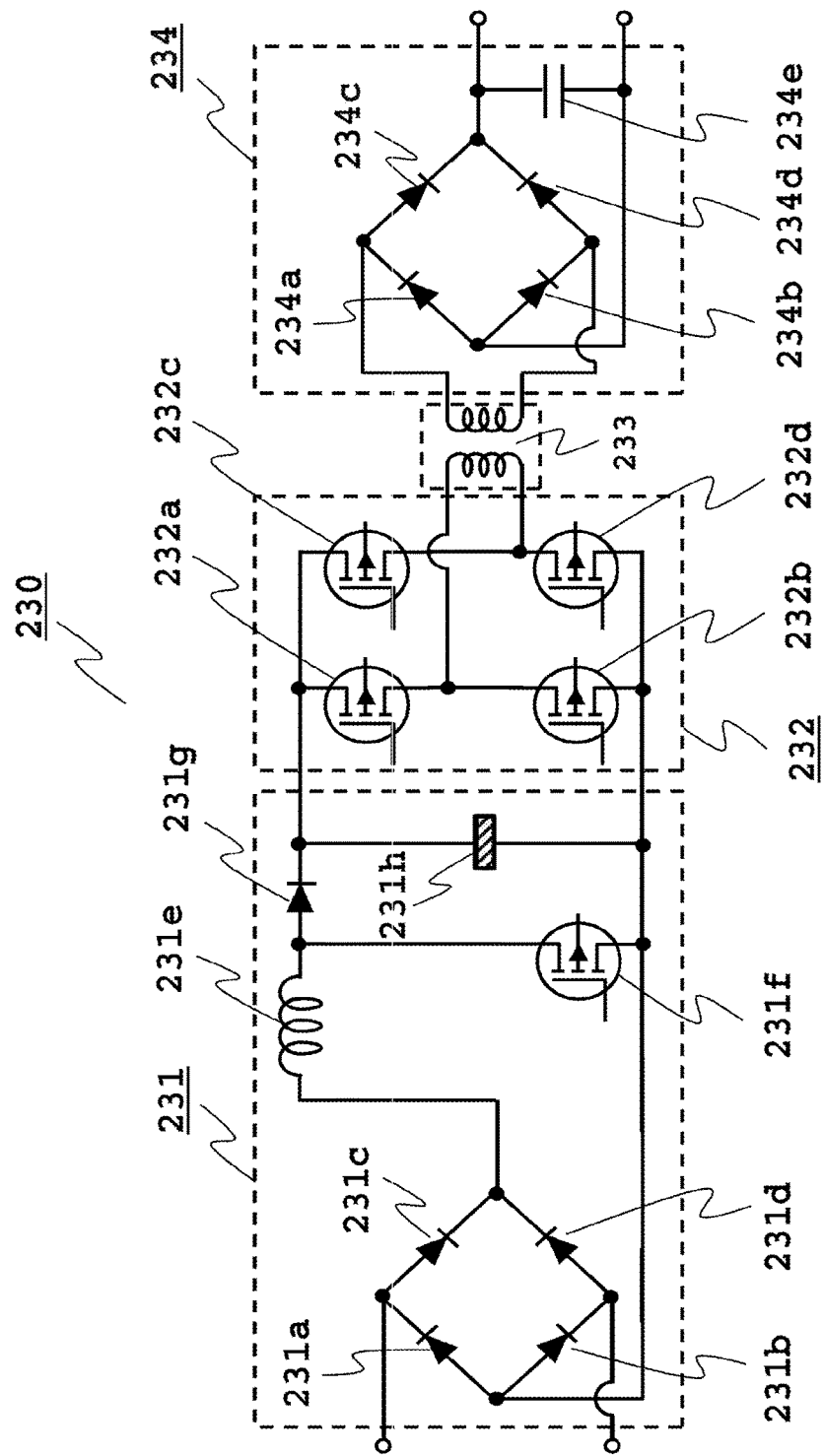
FIG. 34 is a circuit diagram of an AC/DC converter in Embodiment 8.

FIG. 33 is a schematic circuit diagram of an on-board charging device according to Embodiment 8. FIG. 34 is a circuit diagram of an AC/DC converter in Embodiment 8. The on-board charging device is mounted on an electric vehicle (EV) and/or a hybrid electric vehicle (HEV), and charges from a commercial AC power source to an on-board secondary battery. In Embodiment 8, a dual mode choke coil is equipped as a noise filter in the on-board charging device.

As shown in FIG. 33, an on-board charging device 200 is connected to a commercial AC power source 210 that supplies AC power and to an on-board secondary battery 250 to be charged. Further, the on-board charging device 200 is composed of a noise filter 220 and an AC/DC converter 230.

The noise filter 220 includes: a capacitor 221 connected between a power source line 210a and a power source line 210b of the commercial AC power source 210; a dual mode choke coil 1; a capacitor 222 connected between the power source line 210a and the earth; and a capacitor 223 connected between the power source line 210b and the earth.

Furthermore, for example, as shown in FIG. 34, the AC/DC converter 230 is composed of a rectifier circuit with a power factor correction (PFC) circuit 231, an inverter circuit 232, an insulation transformer 233, and a rectifier circuit 234.

The rectifier circuit with the PFC circuit 231 includes: a rectifier circuit composed of four diodes 231a to 231d which constitute a bridge; and a PFC circuit which is composed of a reactor 231e connected to the positive pole side of output, a switching element 231f connected between the reactor 231e and the negative pole side, a diode 231g connected to the reactor 231e, and a smoothing capacitor 231h connected between the diode 231g and the negative pole side. The PFC circuit is to improve rectification efficiency by switching of the switching element 231f. This converts commercial AC into DC.

The inverter circuit 232 is composed of two sets of switching elements MOSFETs 232a, 232b and MOSFETs 232c, 232d; the DC outputted from the rectifier circuit with the PFC circuit 231 is converted into high frequency AC by alternately turning ON/OFF the MOSFETs 232a to 232d. The converted AC is transferred to the rectifier circuit 234 via the insulation transformer 233, is converted into DC by the rectifier circuit 234, and is used for charging the on-board secondary battery. Similarly to the rectifier circuit with the PFC circuit 231, the rectifier circuit 234 has four diodes 234a to 234d which constitute a bridge, and outputs as DC by a smoothing capacitor 234e connected to the output side. ON/OFF operation of the MOSFETs 232a to 232d of the switching circuit 232 is performed to control a pulse width, thereby being able to control an output current.

Since a frequency of the switching operation of the inverter circuit 232 in this embodiment is, for example, 65 kHz, a target is conduction noise of harmonics which are more than or equal to three times as large as 65 kHz, which becomes equal to or higher than 150 kHz specified by the Standard CISPR 25, and these are required to be reduced.

Since the on-board charging device 200 is mounted on an automobile, the conduction noise must not influence on hearing of a car radio as described hereinbefore. In this embodiment, the dual mode choke coil 1 is used as the noise filter of the on-board charging device 200; and thus the conduction noise can be considerably reduced in frequency bands equal to or lower than 1.5 MHz at which the conduction noise becomes the largest and therefore the influence on the hearing of the car radio can be reduced.

As described above, according to the on-board charging device according to Embodiment 8, in order to reduce the conduction noise associated with the switching operation of the inverter circuit that controls a charging current, the dual mode choke coil is equipped as the noise filter; and thus, an effect exists in that the conduction noise can be considerably reduced in the frequency bands equal to or lower than 1.5 MHz.

Incidentally, the present invention can freely combine the respective embodiments and appropriately modify and/or omit the respective embodiments, within the scope of the present invention.

Furthermore, the same reference numerals as those shown in the drawings represent identical or corresponding elements.

DESCRIPTION OF REFERENCE NUMERALS

1,10 Dual mode choke coil, 2,12,22,32 Dual mode core portion, 3 Coil portion, 3a,3c First coil, 3b,3d Second coil, 4,41,42,43,44,45 Lower core, 5a-5d,51a-51d First columnar body to Fourth columnar body, 5f Flat plate, 6a,61a,63a First upper core, 6b,61b,63b Second upper core, 7 Gap, 8 Current direction, 9,9a-9d Magnetic flux direction, 13 Coil portion, 13a First coil, 13b Second coil, 14 Capacitance circuit, 15 Normal mode choke circuit, 17,18 Cut part, 19 Common mode choke circuit, 20 Chip capacitor, 21a-21d Rubber material contained with magnetic substance powder, 30 Through hole, 31 Earth wire, 33 Earth terminal, 62b,62d Tubular body, 100 EPS, 102 Capacitor, 106 DC power source, 121 Microcomputer, 127 Inverter circuit, 126 Motor, 130 Housing, 200 On-board charging device, 210 Commercial AC power source, 220 Noise filter, 230 AC/DC converter, 231 Rectifier circuit with PFC circuit, 232 Inverter circuit, 233 Insulation transformer, 234 Rectifier circuit, and 250 On-board secondary battery.

What is claimed is:

1. A dual mode choke coil comprising:
a lower core made of a magnetic substance, in which four columnar bodies whose respective axes are upright are placed on a quadrilateral square of a flat plate, said columnar bodies being such that a first columnar body and a second columnar body are arranged in parallel to a third columnar body and a fourth columnar body;
a first coil in which the winding direction of a first coil conductor wound around said first columnar body and the winding direction of a third coil conductor wound around said third columnar body are different to each other, and said first coil conductor and said third coil conductor are connected in series;
a second coil in which the winding direction of a second coil conductor wound around said second columnar body and the winding direction of a fourth coil conductor wound around said fourth columnar body are different to each other, and said second coil conductor and said fourth coil conductor are connected in series;
a first upper core made of a magnetic substance, which is brought in contact with upper portions of said first columnar body and said second columnar body; and
a second upper core made of a magnetic substance, which is brought in contact with upper portions of said third columnar body and said fourth columnar body, wherein said first upper core and said second upper core are arranged with a gap formed there between; and
the winding direction of said first coil conductor and the winding direction of said second coil conductor are different.

2. The dual mode choke coil according to claim 1, wherein a cut part is formed in said lower core at a part of the side between said first columnar body and said third columnar body and at a part of the side between said second columnar body and said fourth columnar body, the cut parts being formed in a direction parallel to the gap.

3. The dual mode choke coil according to claim 1, wherein a cut part is formed in said lower core at a part of the side between said first columnar body and said second columnar body and at a part of the side between said third columnar body and said fourth columnar body, the cut parts being formed in a direction perpendicular to the gap.

4. The dual mode choke coil according to claim 1, wherein said first coil and said second coil are constituted by the same type of coil and are in a relationship in which said second coil and said first coil are inverted to each other.

5. The dual mode choke coil according to claim 1, further comprising an elastic body contained with magnetic substance powder, said elastic body being arranged between said first columnar body and said first upper core, between said second columnar body and said first upper core, between said third columnar body and said second upper core, and between said fourth columnar body and said second upper core.

6. The dual mode choke coil according to claim 1, further comprising two tubular bodies provided in a state integrated with each of said first upper core and said second upper core, and
wherein said first columnar body to said fourth columnar body are each fitted into the inside of a respective said tubular body.

7. A high frequency filter comprising said dual mode choke coil as set forth in claim 1,
further comprising at least one capacitor connected between said first coil and said second coil.

8. A high frequency filter comprising said dual mode choke coil as set forth in claim 1,
further comprising: an earth terminal; and
at least one capacitor connected between said earth terminal and said first coil and between said earth terminal and said second coil.

9. An on-board motor integrated electric power steering comprising said dual mode choke coil as set forth in claim 1 on a direct current input side.

10. An on-board charging device comprising said dual mode choke coil as set forth in claim 1 on an alternating current input side.

11. A dual mode choke coil comprising:
a lower core made of a magnetic substance, in which four columnar bodies whose respective axes are upright are placed on a quadrilateral square of a flat plate, said columnar bodies being such that a first columnar body and a second columnar body are arranged in parallel to a third columnar body and a fourth columnar body;
a first coil in which the winding direction of a first coil conductor wound around said first columnar body and the winding direction of a third coil conductor wound around said third columnar body are different to each other, and said first coil conductor and said third coil conductor are connected in parallel;
a second coil in which the winding direction of a second coil conductor wound around said second columnar body and the winding direction of a fourth coil conductor wound around said fourth columnar body are different to each other, and said second coil conductor and said fourth coil conductor are connected in parallel;
a first upper core made of a magnetic substance, which is brought in contact with upper portions of said first columnar body and said second columnar body; and a second upper core made of a magnetic substance, which is brought in contact with upper portions of said third columnar body and said fourth columnar body,
wherein said first upper core and said second upper core are arranged with a gap formed there between; and
the winding direction of said first coil conductor and the winding direction of said second coil conductor are different.

12. The dual mode choke coil according to claim 11, wherein a cut part is formed in said lower core at a part of the side between said first columnar body and said third columnar body and at a part of the side between said second columnar body and said fourth columnar body, the cut parts being formed in a direction parallel to the gap.

13. The dual mode choke coil according to claim 11, wherein a cut part is formed in said lower core at a part of the side between said first columnar body and said second columnar body and at a part of the side between said third columnar body and said fourth columnar body, the cut parts being formed in a direction perpendicular to the gap.

14. The dual mode choke coil according to claim 11, further comprising an elastic body contained with magnetic substance powder, said elastic body being arranged between said first columnar body and said first upper core, between said second columnar body and said first upper core, between said third columnar body and said second upper core, and between said fourth columnar body and said second upper core.

15. The dual mode choke coil according to claim 11, further comprising two tubular bodies provided in a state integrated with each of said first upper core and said second upper core, and
wherein said first columnar body to said fourth columnar body are each fitted into the inside of a respective said tubular body.

16. A high frequency filter comprising said dual mode choke coil as set forth in claim 11,
further comprising at least one capacitor connected between said first coil and said second coil.

17. A high frequency filter comprising said dual mode choke coil as set forth in claim 11,
further comprising: an earth terminal; and
at least one capacitor connected between said earth terminal and said first coil and between said earth terminal and said second coil.

18. An on-board motor integrated electric power steering comprising said dual mode choke coil as set forth in claim 11 on a direct current input side.

19. An on-board charging device comprising said dual mode choke coil as set forth in claim 11 on an alternating current input side.

* * * * *